(12) United States Patent
Hossain

(10) Patent No.: US 12,270,763 B2
(45) Date of Patent: Apr. 8, 2025

(54) SURFACE ENHANCED RAMAN SCATTERING SUBSTRATE

(71) Applicant: KING FAHD UNIVERSITY OF PETROLEUM AND MINERALS, Dhahran (SA)

(72) Inventor: Mohammad Kamal Hossain, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 236 days.

(21) Appl. No.: 17/961,914

(22) Filed: Oct. 7, 2022

(65) Prior Publication Data

US 2024/0118211 A1 Apr. 11, 2024

(51) Int. Cl.
*G01N 21/65* (2006.01)
*C23C 14/02* (2006.01)
*C23C 14/16* (2006.01)
*C23C 14/24* (2006.01)

(52) U.S. Cl.
CPC ......... *G01N 21/658* (2013.01); *C23C 14/021* (2013.01); *C23C 14/16* (2013.01); *C23C 14/24* (2013.01)

(58) Field of Classification Search
CPC .................................................. G01N 21/658
See application file for complete search history.

(56) References Cited

U.S. PATENT DOCUMENTS

| 8,711,351 B1* | 4/2014 | Gibson | G01N 21/658 356/301 |
| 2012/0170032 A1* | 7/2012 | Zhu | G01N 21/658 977/773 |
| 2021/0285089 A1* | 9/2021 | Xiao | C23C 14/34 |
| 2022/0099643 A1 | 3/2022 | Miao et al. | |
| 2022/0317047 A1* | 10/2022 | Awada | G01N 21/658 |
| 2023/0095521 A1* | 3/2023 | Hwang | C23C 18/54 427/430.1 |

FOREIGN PATENT DOCUMENTS

| CN | 110044869 A | 7/2019 |
| CN | 114184597 A1 * | 3/2022 |

OTHER PUBLICATIONS

Hossain, Interstitial-Dependent Enhanced photoluminescence, Journal of Physical Chemsitry, 2017 (Year: 2017).*
Ikramova, Surface-Enhanced Raman Scattering, International Journal of Molecular Sciences, 2022 (Year: 2022).*
(Continued)

*Primary Examiner* — Mary Ellen Bowman
*Assistant Examiner* — Justin J Van Cleave
(74) *Attorney, Agent, or Firm* — Oblon, McClelland, Maier & Neustadt, L.L.P.

(57) ABSTRACT

A surface-enhanced Raman scattering (SERS) substrate includes a silicon substrate having a surface having a plurality of silicon nanostructures (Si-NSs). The silicon nanostructures have a plurality of microscale valleys, and a plurality of terraces in the microscale valleys. The SERS substrate also includes a plurality of silver nanoparticles (Ag-NPs) disposed on the terraces of the silicon nanostructures. A method of preparing the SERS substrate, and a method for measuring SERS signal of an analyte.

20 Claims, 18 Drawing Sheets

(56) References Cited

OTHER PUBLICATIONS

Instructions for operation of a sputter coating apparatus, specifically for Silver, index on archive.org Sep. 21, 2020 (Year: 2020).*
Mosier-Boss, REview of SERS Substrates for Chemical Sensing, nanomaterials, 2017 (Year: 2017).*
Lab experiment instructions for using a thermal evaporator to make silver films, University of Toronto (Year: 2018).*
Kochylas, et al. ; Improved Surface-Enhanced-Raman Scattering Sensitivity Using Si Nanowires/Silver Nanostructures by a Single Step Metal-Assisted Chemical Etching ; MDPI nanomaterials ; Jul. 6, 2021 ; 14 Pages.

* cited by examiner

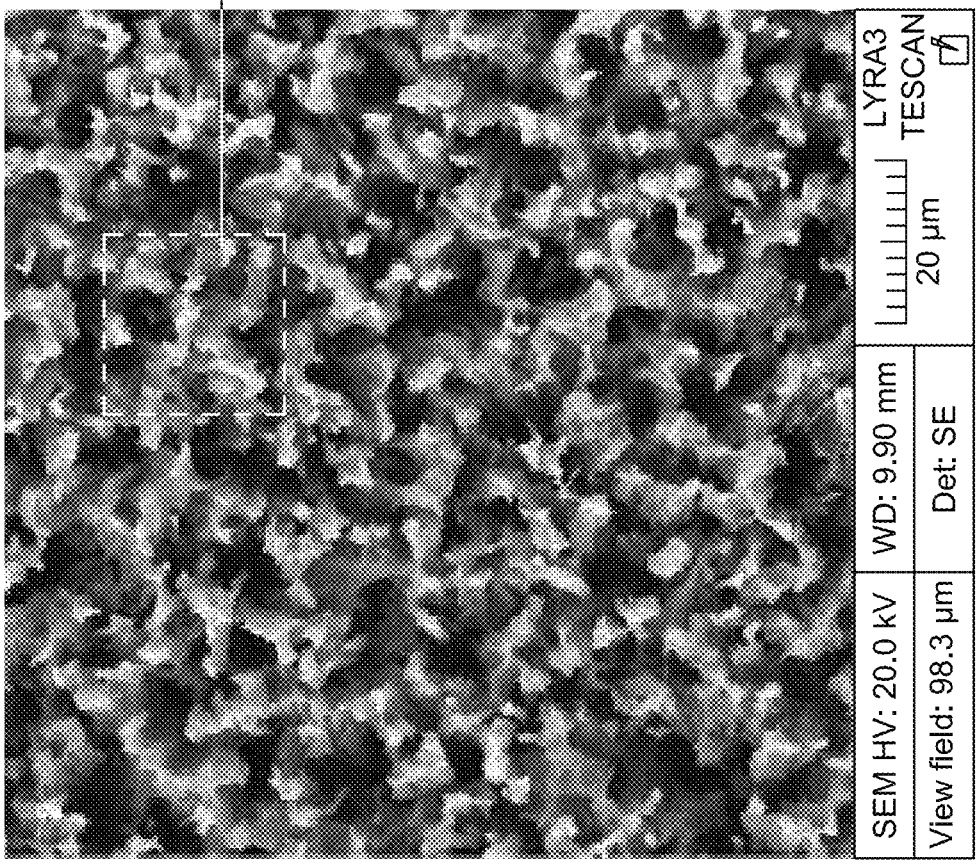
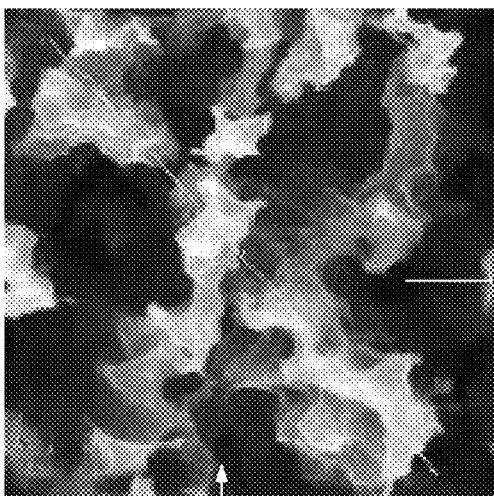
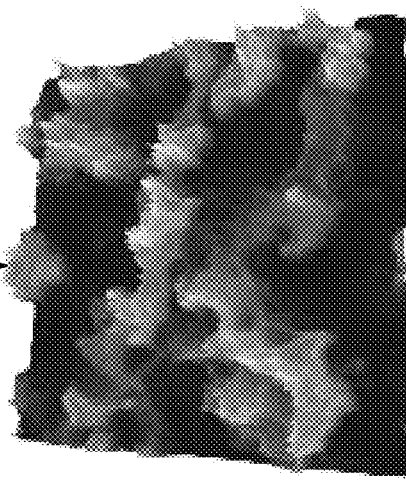
FIG. 2A
FIG. 2B
FIG. 2C

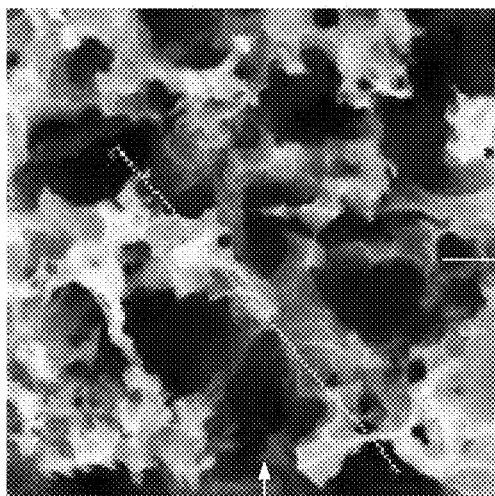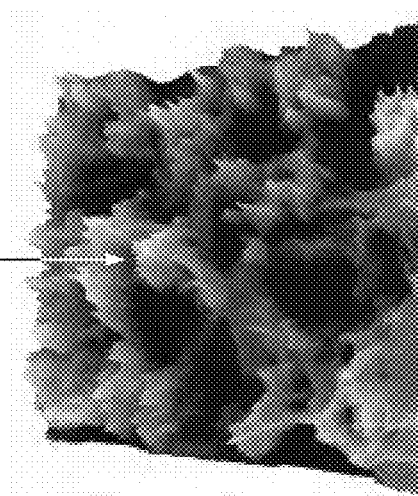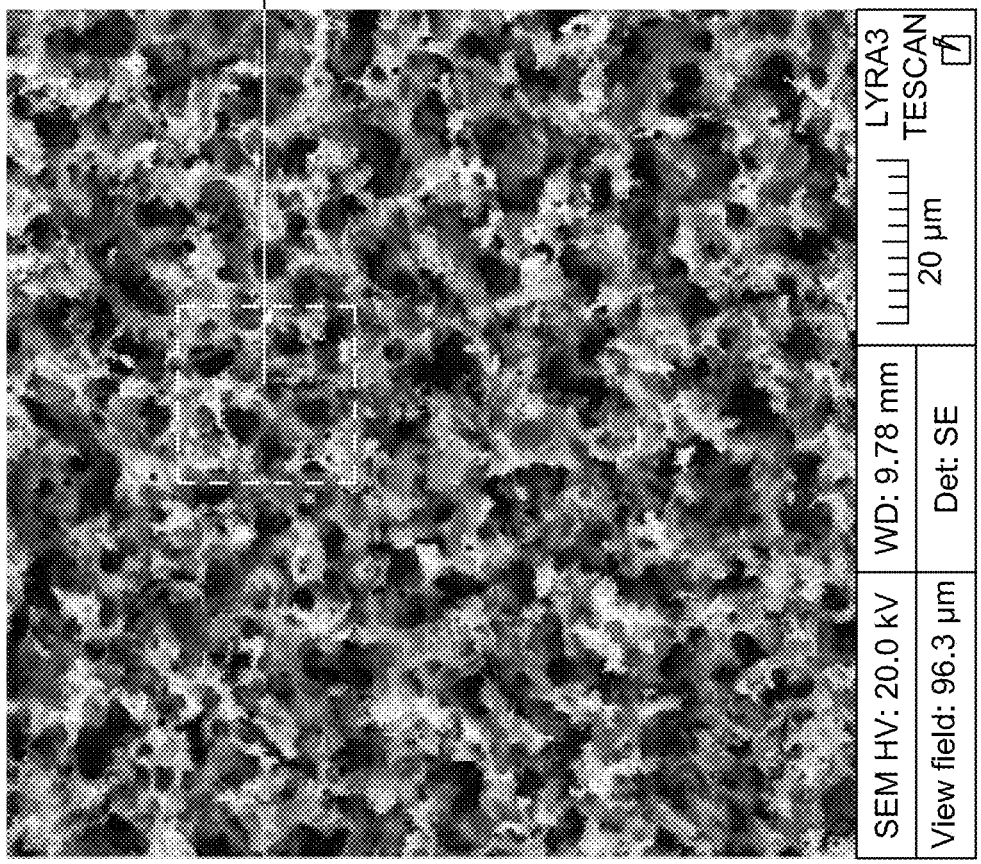
FIG. 3B
FIG. 3C
FIG. 3A

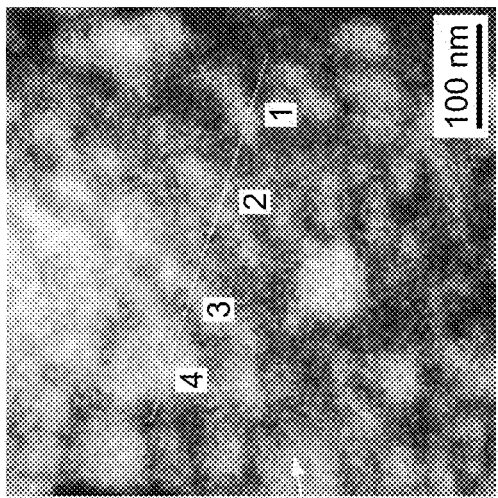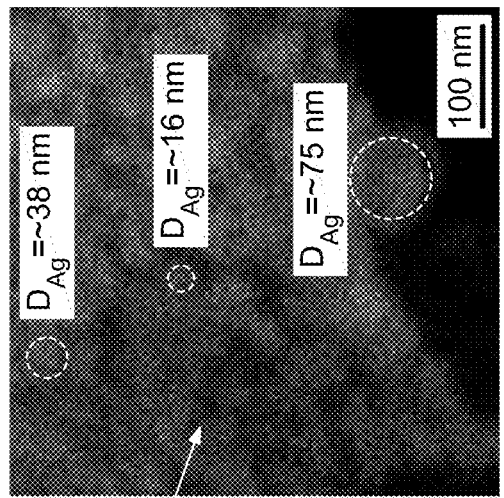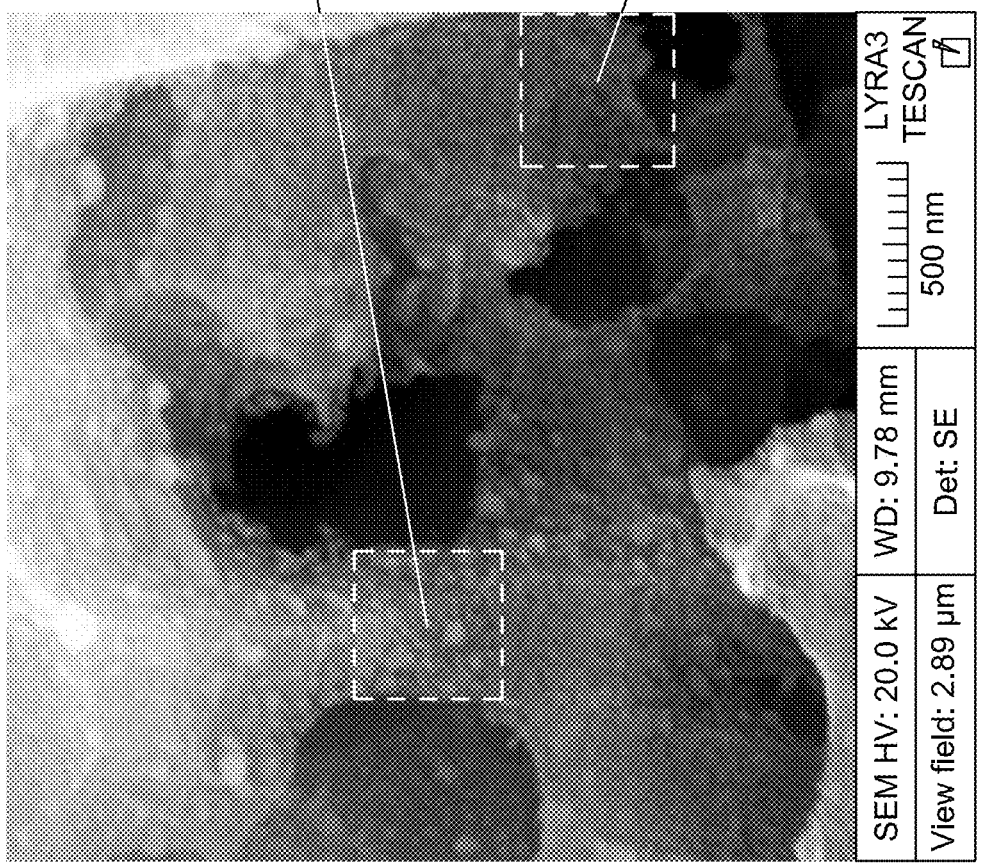
FIG. 4B
FIG. 4C
FIG. 4A

SURFACE ENHANCED RAMAN SCATTERING SUBSTRATE

BACKGROUND

Technical Field

The present disclosure is directed to Raman spectroscopy and spectroscopic imaging, and more particularly relates to a surface-enhanced Raman scattering (SERS) substrate, and a method of detecting an analyte using the surface-enhanced Raman scattering (SERS) substrate.

Description of Related Art

The "background" description provided herein is to generally present the context of the disclosure. Work of the presently named inventors, to the extent it is described in this background section, as well as aspects of the description that may not otherwise qualify as prior art at the time of filing, are neither expressly nor impliedly admitted as prior art against the present invention.

Raman spectroscopic is known as a non-invasive and non-destructive analytical technique that facilitate identification of target analytes without exogenous labels [Liping Xie, Hedele Zeng, Jiaxin Zhu, Zelin Zhang, Hong-bin Sun, Wen Xia, and Yanan Du. "State of the art in flexible SERS sensors toward label-free and onsite detection: from design to applications." Nano Research (2022): 1-21.]. Surface-enhanced Raman scattering (SERS), being a subset of standard Raman spectroscopic techniques, provides detailed and fingerprint information about materials at the molecular level. Moreover, the SERS technique has been evolved into multidisciplinary research area encompassing diverse areas of interests including fast and accurate detection of the biomolecules, antibiotics, food additives and single-molecules due to the success enhancement in Raman cross-sections [Zhuangsheng Lin, and Lili He. "Recent advance in SERS techniques for food safety and quality analysis: A brief review." Current Opinion in Food Science 28 (2019): 82-87; Jolanta Bukowska, and Piotr Piotrowski. "Surface-enhanced Raman scattering (SERS) in bioscience: a review of application." Optical Spectroscopy and Computational Methods in Biology and Medicine (2014): 29-59; Xi Xi, and Chongyang Liang. "Perspective of future SERS clinical application based on current status of Raman spectroscopy clinical trials." Frontiers in Chemistry 9 (2021); Cialla, Dana, Sibyll Pollok, Carolin Steinbrucker, Karina Weber, and Jurgen Popp. "SERS-based detection of biomolecules." Nanophotonics 3, no. 6 (2014): 383-411; Pamela A Mosier-Boss. "Review on SERS of Bacteria." Biosensors 7, no. 4 (2017): 51; Shyh-Chyang Luo, Kundan Sivashanmugan, Jiunn-Der Liao, Chih-Kai Yao, and Han-Chi Peng. "Nanofabricated SERS-active substrates for single-molecule to virus detection in vitro: A review." Biosensors and Bioelectronics 61 (2014): 232-240; Darya Radziuk, and Helmuth Moehwald. "Prospects for plasmonic hot spots in single molecule SERS towards the chemical imaging of live cells." Physical Chemistry Chemical Physics 17, no. 33 (2015): 21072-21093; Duncan Graham, Martin Moskovits, and Zhong-Qun Tian. "SERS-facts, figures and the future." Chemical Society Reviews 46, no. 13 (2017): 3864-3865; Yang Yu, Ting-Hui Xiao, Yunzhao Wu, Wanjun Li, Qing-Guang Zeng, Li Long, and Zhi-Yuan Li. "Roadmap for single-molecule surface-enhanced Raman spectroscopy." Advanced Photonics 2, no. 1 (2020): 014002; Martin Fleischmann, Patrick J. Hendra, and A. James McQuillan. "Raman spectra of pyridine adsorbed at a silver electrode." Chemical physics letters 26, no. 2 (1974): 163-166; David L. Jeanmaire, and Richard P. Van Duyne. "Surface Raman spectroelectrochemistry: Part I. Heterocyclic, aromatic, and aliphatic amines adsorbed on the anodized silver electrode." Journal of electroanalytical chemistry and interfacial electrochemistry 84, no. 1 (1977): 1-20; M. Grant Albrecht, and J. Alan Creighton. "Anomalously intense Raman spectra of pyridine at a silver electrode." Journal of the american chemical society 99, no. 15 (1977): 5215-5217; Moskovits, M. "Surface roughness and the enhanced intensity of Raman scattering by molecules adsorbed on metals." The Journal of Chemical Physics 69, no. 9 (1978): 4159-4161.]. This cross-section enhancement of Raman scattering is also known as SERS-active hotspots (SHSs). In order to achieve this cross-section enhancement, two mechanicians have been developed including electromagnetic (EM) mechanism (EM enhancement) and chemical mechanism (CE enhancement). Typically, the EM mechanism is the dominant contributor to the enhancement, reching enhancement factors as high as $10^5$-$10^7$. In the EM mechanism, a surface plasmon resonance of a suitable plasmonic material creastes a much stronger electromagnetic field located very close to the plasmonic material, typically within a few to tens of nanometers. This enhanced electromangetic field is refered to as the localized surface plasmon resonance (LSPR)-mediated electromagnetic (EM) field and is the main component that makes such tremendous amplification of standard Raman signal of target analyte [David L. Jeanmaire, and Richard P. Van Duyne. "Surface Raman spectroelectrochemistry: Part I. Heterocyclic, aromatic, and aliphatic amines adsorbed on the anodized silver electrode." Journal of electroanalytical chemistry and interfacial electrochemistry 84, no. 1 (1977): 1-20; Moskovits, M. "Surface roughness and the enhanced intensity of Raman scattering by molecules adsorbed on metals." The Journal of Chemical Physics 69, no. 9 (1978): 4159-4161.]. Since then research on single molecule SERS (SM-SERS) and nano-engineering of SERS-active substrates have become the key focus of the SHSs [Song-Yuan Ding, En-Ming You, Zhong-Qun Tian, and Martin Moskovits. "Electromagnetic theories of surface-enhanced Raman spectroscopy." Chemical Society Reviews 46, no. 13 (2017): 4042-4076; Zhong Wang, Kesu Cai, Yang Lu, Haining Wu, Yuee Li, and Qingguo Zhou. "Insight into the working wavelength of hotspot effects generated by popular nanostructures." Nanotechnology Reviews 8, no. 1 (2019): 24-34; Ming Xia, Pei Zhang, Kuan Qiao, Yu Bai, and Ya-Hong Xie. "Coupling SPP with LSPR for enhanced field confinement: A simulation study." The Journal of Physical Chemistry C 120, no. 1 (2016): 527-533; Mohammad Hossain, Yasutaka Kitahama, and Yukihiro Ozaki. "Half-raspberry-like bimetallic nanoassembly: Interstitial dependent correlated surface plasmon resonances and surface-enhanced Raman spectroscopy." Physical Chemistry Chemical Physics 23, no. 41 (2021): 23875-23885; Mohammad Hossain, Qasem Ahmed Drmosh, and Md Arifuzzaman. "Silver nanoparticles, nanoneedles and nanorings: impact of electromagnetic near-field on surface-enhanced Raman scattering." Physical Chemistry Chemical Physics 24, no. 15 (2022): 8787-8799.], however, such SHSs are heavily influenced by the nanogeometry of the SHSs, as well as the the relative position of the molecules in the SHSs [Mohammad Hossain. "Nanoassembly of gold nanoparticles: An active substrate for size-dependent surface-enhanced Raman scattering." Spectrochimica Acta Part A: Molecular and Biomolecular Spectroscopy 242 (2020): 118759.]. Therefore, there is a critical challenge to design a SERS-active substrate of abundant and well-controlled SHSs that facilitate higher enhancement and provide reproducible and predictable SERS-activity for a wide range of analytes [Kohei Imura, Hiromi Okamoto, Mohammad K. Hossain, and Masahiro Kitajima. "Visualization of localized intense optical fields in single gold— nanoparticle assemblies and ultrasensitive Raman active sites." Nano letters 6, no. 10 (2006): 2173-2176; Mohammad K. Hossain, Geoff R. Willmott, Pablo G. Etchegoin, Richard J. Blaikie, and Jeffery L. Tallon. "Tunable SERS using gold nanoaggregates on an elastomeric substrate." Nanoscale 5, no. 19 (2013): 8945-8950.].

On one hand, sutides reveal that the fabrication of plasmonic nanostructures of SERS hotspots (SHSs) straddling from zero (0D)-, one (1D)-, two (2D)- to three-dimensional (3D) spaces can induce strong EM near-filed. In 0D and 1D spaces, SHSs are recognized due to limited interstitials and LSPRs, whereas in 2D space, number of SHSs increases and LSPRs excitations intermingled through hybridizations and coalescences [Mohammad Kamal Hossain, Yasutaka Kitahama, Vasudevanpillai Biju, Tamitake Itoh, Tadaaki Kaneko, and Yukihiro Ozaki. "Surface plasmon excitation and surface-enhanced Raman scattering using two-dimensionally close-packed gold nanoparticles." The Journal of Physical Chemistry C 113, no. 27 (2009): 11689-11694; Mohammad Kamal Hossain, Toru Shimada, Masahiro Kitajima, Kohei Imura, and Hiromi Okamoto. "Near-field Raman imaging and electromagnetic field confinement in the self-assembled monolayer array of gold nanoparticles." Langmuir 24, no. 17 (2008): 9241-9244.]. Furthermore, 3D concept of SHSs arrangement wherein SHSs spread over x-, y- and z-planes has been reported to boost intensity substantially due to extensive plasmonic coupling within the laser excitation volumes [Jinjie Li, Heng Yan, Xuecai Tan, Zhicheng Lu, and Heyou Han. "Cauliflower-inspired 3D SERS substrate for multiple mycotoxins detection." Analytical chemistry 91, no. 6 (2019): 3885-3892; Mohammad Kamal Hossain, Qasem Ahmed Drmosh, and Amar Kamal Mohamedkhair. "Plasmonic Pollen Grain Nanostructures: A Three-Dimensional Surface-Enhanced Raman Scattering (SERS)-Active Substrate." Chemistry—An Asian Journal 16, no. 13 (2021): 1807-1819; Qi Zhang, Yih Hong Lee, In Yee Phang, Choon Keong Lee, and Xing Yi Ling. "Hierarchical 3D SERS Substrates Fabricated by Integrating Photolithographic Microstructures and Self-Assembly of Silver Nanoparticles." Small 10, no. 13 (2014): 2703-2711; Jihua Xu, Chonghui Li, Haipeng Si, Xiaofei Zhao, Lin Wang, Shouzhen Jiang, Dongmei Wei, Jing Yu, Xianwu Xiu, and Chao Zhang. "3D SERS substrate based on Au—Ag bimetal nanoparticles/MoS 2 hybrid with pyramid structure." Optics express 26, no. 17 (2018): 21546-21557; Yiwu Qian, Guowen Meng, Qing Huang, Chuhong Zhu, Zhulin Huang, Kexi Sun, and Bin Chen. "Flexible membranes of Ag-nanosheet-grafted polyamide-nanofibers as effective 3D SERS substrates." Nanoscale 6, no. 9 (2014): 4781-47881. To the extent, cascaded multiscale electromagnetic (EM) field enhancement due to the incorporation of terraces in elongated and plasmonic nanogaps increases number of SHSs available on the entire substrate [Su Yeon Lee, Shin-Hyun Kim, Minsoo P. Kim, Hwan Chul Jeon, Hyelim Kang, Hyeong Jun Kim, Bumjoon J. Kim, and Seung-Man Yang. "Freestanding and arrayed nanoporous microcylinders for highly active 3D SERS substrate." Chemistry of Materials 25, no. 12 (2013): 2421-2426; Ren Lu, Jian Sha, Weiwei Xia, Yanjun Fang, Lin Gu, and Yewu Wang. "A 3D-SERS substrate with high stability: Silicon nanowire arrays decorated by silver nanoparticles." CrystEngComm 15, no. 31 (2013): 6207-6212.].

On the other hand, it is also necessary to devise a plasmonic platform that can hold multitude of SHSs spanning over different planes, such as tuneable plasmonic gaps, arrays of holes, tips, arbitrary spikes and nanoparticles array [Jiyeon Kim, Kyunjong Sim, Seungsang Cha, Jeong-Wook Oh, and Jwa-Min Nam. "Single-particle analysis on plasmonic nanogap systems for quantitative SERS." Journal of Raman Spectroscopy 52, no. 2 (2021): 375-385; Andreas B. Dahlin, "Sensing applications based on plasmonic nanopores: The hole story." Analyst 140, no. 14 (2015): 4748-4759; Yuduo Guan, Zengyao Wang, Panpan Gu, Yu Wang, Wei Zhang, and Gang Zhang. "An in situ SERS study of plasmonic nanochemistry based on bifunctional "hedgehog-like" arrays." Nanoscale 11, no. 19 (2019): 9422-9428; Verma, A. K., and R. K. Soni. "Multi-spiked silver stars for ultrasensitive and multiplexed SERS detection of analytes." Journal of Physics D: Applied Physics 54, no. 47 (2021): 475107; Mohammad Kamal Hossain, Ayman Wajeh Mukhaimer, and Mohammad Al-Jabari. "Fabrication and characterizations of arbitrary-shaped silver nanoparticles for surface-enhanced fluorescence microscopy." Journal of Nanoparticle Research 23, no. 4 (2021): 1-14; Serrano-Montes, Ana B., Dorleta Jimenez de Aberasturi, Judith Langer, Juan J. Giner-Casares, Leonardo Scarabelli, Ada Herrero, and Luis M. Liz-Marzan. "A general method for solvent exchange of plasmonic nanoparticles and self-assembly into SERS-active monolayers." Langmuir 31, no. 33 (2015): 9205-9213.]. However, it has been a great challenge to control the growth and geometry of such plasmonic nanostructures with sufficient accuracy. In accordance with the present disclosure, a substrate with silicon nanostructures (Si-NSs) has been fabricated with accurate control of geometry to provide. The fabricated substrate not only has high surface areas, high densities, high roughness, and high concentrations of the characteristic tips [B. Salhi, M. K. Hossain, A. W. Mukhaimer, and F. A Al-Sulaiman. "Nanowires: a new pathway to nanotechnology-based applications." Journal of electroceramics 37, no. 1 (2016): 34-49; Sudha Mokkapati, and Chennupati Jagadish. "Review on photonic properties of nanowires for photovoltaics." Optics express 24, no. 15 (2016): 17345-17358; Li Na Quan, Joohoon Kang, Cun-Zheng Ning, and Peidong Yang. "Nanowires for photonics." Chemical reviews 119, no. 15 (2019): 9153-9169; Brian Piccione, Carlos O. Aspetti, Chang-Hee Cho, and Ritesh Agarwal. "Tailoring light-matter coupling in semiconductor and hybrid-plasmonic nanowires." Reports on Progress in Physics 77, no. 8 (2014): 086401.], but also exhibits high light-scattering leading to increased number of the sites of electric field confinements and thus enhance the ensemble SERS signals [Yuan Li, John Dykes, Todd Gilliam, and Nitin Chopra. "A new heterostructured SERS substrate: free-standing silicon nanowires decorated with graphene-encapsulated gold nanoparticles." Nanoscale 9, no. 16 (2017): 5263-5272; Ardeshir Moeinian, Fatih N. Gur, Julio Gonzalez-Torres, Linsen Zhou, Vignesh D. Murugesan, Ashkan Djaberi Dashtestani, Hua Guo, Thorsten L. Schmidt, and Steffen Strehle. "Highly localized SERS measurements using single silicon nanowires decorated with DNA origami-based SERS probe." Nano Letters 19, no. 2 (2019): 1061-1066.].

Nam et al. discloses a method of preparing vertically oriented multistack nanogaps on individual nanopillar [Wonil Nam, Xiang Ren, Seied Ali Safiabadi Tali, Parham Ghassemi, Inyoung Kim, Masoud Agah, and Wei Zhou. "Refractive-index-insensitive nanolaminated SERS substrates for label-free raman profiling and classification of living cancer cells." Nano Letters 19, no. 10 (2019): 7273-

7281.].Bai et al. reports a SERS substrate consisting of a dense array of silicon nanowires (Si-NWs) decorated by silver nanoparticles (Ag-NPs) provided enhancement factors of the order of 108 [Shi Bai, Yongjun Du, Chunyan Wang, Jian Wu, and Koji Sugioka. "Reusable surface-enhanced Raman spectroscopy substrates made of silicon nanowire array coated with silver nanoparticles fabricated by metal-assisted chemical etching and photonic reduction." Nanomaterials 9, no. 11 (2019): 1531.]. Lin et. al describes a method of making gold nanoparticles decorated silicon nanorods having EFs as high as 107 [Dongdong Lin, Zilong Wu, Shujie Li, Wenqi Zhao, Chongjun Ma, Jie Wang, Zuimin Jiang, Zhenyang Zhong, Yuebing Zheng, and Xinju Yang. "Large-area Au-nanoparticle-functionalized Si nanorod arrays for spatially uniform surface-enhanced Raman spectroscopy." ACS nano 11, no. 2 (2017): 1478-1487.]. Likewise, Huang et al. discloses an ordered array of silicon nanorods decorated by Ag-NPs having EFs as high as 106 [Jian-An Huang, Ying-Qi Zhao, Xue-Jin Zhang, Li-Fang He, Tai-Lun Wong, Ying-San Chui, Wen-Jun Zhang, and Shuit-Tong Lee. "Ordered Ag/Si nanowires array: wide-range surface-enhanced Raman spectroscopy for reproducible biomolecule detection." Nano letters 13, no. 11 (2013): 5039-5045.]. Additionally, SERS-active silver dendrite network developed on silicon shows sensitive detection of lysozyme with EF of 2.4×106 is reported by Faro et al. [Lo Faro, Maria Jose, Cristiano D'Andrea, Antonio Alessio Leonardi, Dario Morganti, Alessia Irrera, and Barbara Fazio. "Fractal silver dendrites as 3D SERS platform for highly sensitive detection of biomolecules in hydration conditions." Nanomaterials 9, no. 11 (2019): 1630.]. Furthermore, Schmidt et al. discloses SERS-active silicon nanopillars decorated by silver achieving large number of SHSs [Michael Schmidt, Jorg Hubner, and Anja Boisen. "Large area fabrication of leaning silicon nanopillars for surface enhanced Raman spectroscopy." Advanced Materials 24, no. 10 (2012): OP11-OP18.].

Practical approaches have been developed in the art, however these approaches often involve (i) complicated preparation process, (ii) lack of reproducibility, and (iii) lack of accurate geometry control. Hence, there is a need for improved SERS techniques that can facilitate the population of SHSs and affect reproducible and enhanced SERS-activities.

In view of the forgoing, one objective of the present disclosure is to provide a surface-enhanced Raman scattering (SERS) substrate with a controlled nanostructure. A further objective of the present disclosure is to provide a method of making the SERS substrate. A third objective of the present disclosure is to describe a method of detecting an analyte using the SERS substrate.

SUMMARY

In an exemplary embodiment, a surface-enhanced Raman scattering (SERS) substrate is described. The SERS substrate includes a silicon substrate having a surface having a plurality of silicon nanostructures (Si-NSs). In some embodiments, the silicon nanostructures have a plurality of microscale valleys. In some embodiments, the silicon nanostructures have a plurality of terraces in the microscale valleys. The SERS substrate also includes a plurality of silver nanoparticles (Ag-NPs) disposed on the terraces of the silicon nanostructures. In some embodiments, the Ag-NPs have a mean particle size of 5 to 90 nanometers (nm).

In some embodiments, the microscale valleys have a width of 1 to 20 micrometers (1 μm) on a surface of the silicon substrate.

In some embodiments, a distance measured from the highest point of a microscale valley to the lowest point of the same microscale valley is in a range of 1 to 100 μm.

In some embodiments, the terraces have a step structure. In some embodiments, the terraces have an average width of 0.5 to 5 micrometers (1 μm).

In some embodiments, the Ag-NPs have a mean particle size of 10 to 50 nm.

In some embodiments, the Ag-NPs are at least one form selected from the group consisting of nanospheres, nanorods, nanostars, nanotriangles, nanoprisms, nanocubes, nanofibers, nanoplates, nanowires, nanotetrahedrons, nanocrystals, nanohexagons, nanodisks, nanoribbons, nanocylinders, nanogranules, nanowhiskers, nanoflakes, nanofoils, nanopowders, nanoholes, nanobelts, nanourchins, nanoflowers, nanoislands, and nanomeshes.

In some embodiments, the Ag-NPs on the SERS substrate have a coverage density of $1 \times 10^{10}$ to $7 \times 10^{10}$ particles $cm^{-2}$.

In some embodiments, the SERS substrate has an electromagnetic (EM) intensity of 2 to volts per meter (V/m).

In another exemplary embodiment, a method of preparing the SERS substrate includes treating the silicon (Si) substrate in a first aqueous solution containing HF and a metal salt to form a treated Si substrate. In addition, the method includes etching the treated Si substrate in a second aqueous solution containing HF and $H_2O_2$ and washing with a third aqueous solution containing $H_2O$ and at least one acid to form an Si substrate with etched silicon nanostructures (Si-NSs). Moreover, the method includes at least partially thermally evaporating the metal particles of a metal target onto the silicon substrate with etched silicon nanostructures to form the SERS substrate.

In some embodiments, the silicon substrate is a p-type silicon wafer.

In some embodiments, the metal salt is at least one selected from the group consisting of a gold (Au) salt, a silver (Ag) salt, a copper (Cu) salt, a platinum (Pt) salt, an iron (Fe) salt, and a palladium (Pd) salt.

In some embodiments, the metal salt is silver nitrate (AgNO3).

In some embodiments, a molar ratio of HF to the metal salt is 500:1 to 50:1.

In some embodiments, the acid is at least one selected from the group consisting of hydrochloric acid, sulfuric acid, phosphoric acid, nitric acid, acetic acid, boric acid, oxalic acid, citric acid, carbonic acid, perchloric acid, chlorous acid, nitrous acid, ethanoic acid, hypochlorous acid, and hydrocyanic acid.

In some embodiments, the acid contains hydrochloric acid and nitric acid.

In some embodiments, the metal particles of the metal target are thermally evaporated at a temperature of 700 to 1500° C. at a power of 0.1 to 2 amperes (A) per milligram of the metal target under vacuum. In some embodiments, the metal particles are silver particles, and the metal is silver.

In some embodiments, a method for measuring surface enhanced Raman scattering (SERS) signal of an analyte. The method includes contacting the analyte with the SERS substrate of claim 1 to form a sample. The method also includes exposing the sample to laser light such that a portion of the laser light is scattered by the sample to form scattered light. In addition, the method involves detecting the scattered light. In some embodiments, the analyte has a Raman scattering signal that is enhanced relative to that of the analyte without contacting with the SERS substrate.

In some embodiments, the analyte comprises at least one molecule selected from the group consisting of a synthetic molecule, a protein, a deoxyribonucleic acid sequence, a ribonucleic acid sequence, an amino acid, a peptide, a nucleotide, a nucleoside, and a neurotransmitter.

In some embodiments, the analyte contains Rhodamine 6G.

In some embodiments, the laser light has a wavelength of 600 to 650 nm, and the SERS substrate has an enhancement factor of $3 \times 10^5$ to $50 \times 10^5$.

The foregoing general description of the illustrative present disclosure and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein:

FIG. 2A illustrates a field emission scanning electron microscope (FESEM) micrograph of the silicon nanostructures (Si-NSs), according to certain embodiments;

FIG. 2B illustrates a magnified view of an area (20 nm×20 nm) as marked by the dotted square in FIG. 2A, according to certain embodiments;

FIG. 2C illustrates a hawk-eye view (3D) of the same confirming terraces as shown in FIG. 2B of various sizes available in Si-NSs, according to certain embodiments;

FIG. 3A illustrates a FESEM micrograph of Ag-NPs-decorated terraces in Si-NSs, according to certain embodiments;

FIG. 3B illustrates a magnified view of an area (20 nm×20 nm) as marked by the dotted square in FIG. 3A, according to certain embodiments;

FIG. 3C illustrates a hawk-eye view (3D) of the same confirming terraces as shown in FIG. 3B of various sizes available in Ag-NPs-decorated terraces in Si-NSs, according to certain embodiments;

FIG. 4A illustrates a high-resolution FESEM micrograph of Ag-decorated terraces in Si-NSs, according to certain embodiments;

FIG. 4B illustrates a magnified view of a first area (500 nm×500 nm) as marked by the dotted square in FIG. 4A, according to certain embodiments;

FIG. 4C illustrates a magnified view of a second area (500 nm×500 nm) as marked by the dotted square in FIG. 4A confirming different sizes and shapes of Ag-NPs, according to certain embodiments;

DETAILED DESCRIPTION

Figure 1:
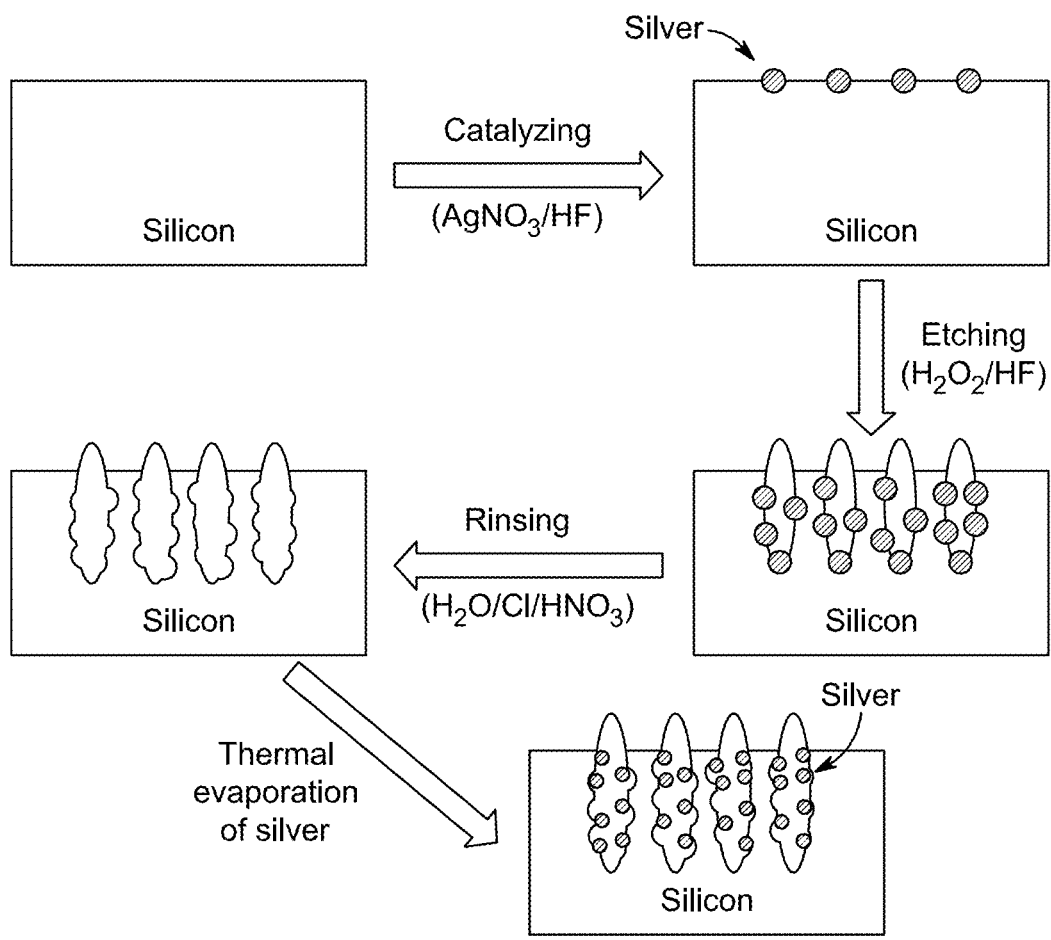
FIG. 1 is a schematic flow diagram of a method of preparing the SERS substrate, according to certain embodiments.

In the following description, it is understood that other embodiments may be utilized, and structural and operational changes may be made without departure from the scope of the present embodiments disclosed herein.

In the drawings, reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

As used herein, the terms "optional" or "optionally" means that the subsequently described event(s) can or cannot occur or the subsequently described component(s) may or may not be present (e.g., 0 wt. %).

As used herein, the term "sonicating" refers to a process of applying sound energy to agitate particles or discontinuous fibers in a liquid.

As used herein, the term "nanoparticles" refers to a small particle that ranges between 1 to 100 nanometers in size.

Surface-enhanced Raman scattering (SERS) is a popular and widely used detection technique. SERS-active platform with multitude of SERS-active hotspots (SHSs) spanning over different planes can further boost the SERS fingerprint signal qualitatively and quantitatively. Silicon nanostructures (Si-NSs) are fabricated using metal catalyzed electroless etching technique and treated further to have wide exposure of terraces available within the as-fabricated Si-NSs. The terraces with high surface area are then decorated with Ag-NPs. The newly fabricated Ag-NPs-decorated Si-NSs are characterized with various analytical methods and techniques, and its SERS-activity is also evaluated by Rhodamine 6G (R6G).

According to a first aspect, the present disclosure relates to a surface-enhanced Raman scattering (SERS) substrate. The SERS substrate includes (i) a silicon substrate having a surface having a plurality of silicon nanostructures (Si-NSs).

In some embodiments, the silicon substrate may be supported on a solid support. In some further embodiments, the solid support may be any suitable material known to one of ordinary skill in the art. Examples of the solid support include, but are not limited to silicon wafer, glass, thermoplastic, metal oxide such as ITO, transparent, opaque, porous, non-porous and any inert material that does not react with the porous oxide layer. In addition, examples of suitable solid support include, but are not limited to glass, sapphire, diamond, silicon, geranium, a binary semiconductor such as gallium arsenide, zinc sulfide, and cadmium selenide, a metal such as titanium, nickel, chromium, aluminum, and copper, and mixtures thereof.

In some embodiments, the silicon nanostructures have a plurality of microscale valleys. In some further embodiments, the microscale valleys have a width of 1 to 20 micrometers (1 μm) on a surface of the silicon substrate. In some even more embodiments, the microscale valleys have a width of 3 to 18 μm, preferably 5 to 16 μm, preferably 7 to 14 μm, preferably 9 to 12 μm on the surface of the silicon substrate. Other ranges are also possible.

In some further embodiments, a distance measured from the highest point of a microscale valley to the lowest point of the same microscale valley is in a range of 1 to 100 μm, preferably to 90 μm, preferably 20 to 80 μm, preferably 30 to 70 μm, preferably 40 to 60 μm, or even preferably about 50 μm. Other ranges are also possible.

Even further, in some embodiments, the silicon nanostructures have a plurality of terraces in the microscale valleys. In certain embodiments, the terraces have a step structure. In other certain embodiments, the terraces have an average width of 0.1 to 5 μm, preferably 0.5 to 4.5 μm, preferably 1 to 4 μm, preferably 1.5 to 3.5 μm, or even preferably 1.5 to 3 μm. Other ranges are also possible, The SERS substrate further includes (ii) a plurality of silver nanoparticles (Ag-NPs) disposed on the terraces of the silicon nanostructures. In some embodiments the Ag-NPs have a mean particle size of 5 to 90 nm, preferably 10 to 80 nm, preferably 15 to 70 nm, preferably 20 to 60 nm, preferably 25 to 50 nm, or even preferably 30 to 40 nm. Other ranges are also possible.

In some embodiments, the Ag-NPs are at least one form selected from the group consisting of nanospheres, nanorods, nanostars, nanotriangles, nanoprisms, nanocubes, nanofibers, nanoplates, nanowires, nanotetrahedrons, nanocrystals, nanohexagons, nanodisks, nanoribbons, nanocylinders, nanogranules, nanowhiskers, nanoflakes, nanofoils, nanopowders, nanoholes, nanobelts, nanourchins, nanoflowers, nanoislands, and nanomeshes. In some preferred embodiments, the Ag-NPs are nanospheres, nanorods, nanowires.

In embodiments where the silver nanoparticles are spherical, the particle size may refer to a particle diameter. In embodiments where the silver nanoparticles are polyhedral, the particle size may refer to the diameter of a circumsphere. In some embodiments, the particle size refers to a mean distance from a particle surface to particle centroid or center of mass. In alternative embodiments, the particle size refers to a maximum distance from a particle surface to a particle centroid or center of mass. In some embodiments where the silver nanoparticles have an anisotropic shape such as nanorods, the particle size may refer to a length of the nanorod, a width of the nanorod, an average of the length and width of the nanorod. In some embodiments in which the silver nanoparticles have non-spherical shapes, the particle size refers to the diameter of a sphere having an equivalent volume as the particle. In some embodiments in which the silver nanoparticles have non-spherical shapes, the particle size refers to the diameter of a sphere having an equivalent diffusion coefficient as the particle.

In some embodiments, the silver nanoparticles of the present disclosure are monodisperse, having a coefficient of variation or relative standard deviation, expressed as a percentage and defined as the ratio of the particle size standard deviation (a) to the particle size mean (0 multiplied by 100 of less than 25%, preferably less than 10%, preferably less than 8%, preferably less than 6%, preferably less than 5%, preferably less than 4%, preferably less than 3%, preferably less than 2%. In some embodiments, the silver nanoparticles of the present disclosure are monodisperse having a particle size distribution ranging from 80% of the average particle size to 120% of the average particle size, preferably 90 to 110%, preferably 95 to 105% of the average particle size. In some embodiments, the silver nanoparticles are not monodisperse. In some other embodiments, the silver nanoparticles are dimers and trimers.

In general, the particle size may be determined by any suitable method known to one of ordinary skill in the art. In some embodiments, the particle size is determined by powder X-ray diffraction (PXRD). Using PXRD, the particle size may be determined using the Scherrer equation, which relates the full-width at half-maximum (FWHM) of diffraction peaks to the size of regions comprised of a single crystalline domain (known as crystallites) in the sample. In some embodiments, the crystallite size is the same as the particle size. For accurate particle size measurement by PXRD, the particles should be crystalline, comprise only a single crystal, and lack non-crystalline portions. Typically, the crystallite size underestimates particle size compared to other measures due to factors such as amorphous regions of particles, the inclusion of non-crystalline material on the surface of particles such as bulky surface ligands, and particles which may be composed of multiple crystalline domains. In some embodiments, the particle size is determined by dynamic light scattering (DLS). DLS is a technique which uses the time-dependent fluctuations in light scattered by particles in suspension or solution in a solvent, typically water to measure a size distribution of the particles. Due to the details of the DLS setup, the technique measures a hydrodynamic diameter of the particles, which is the diameter of a sphere with an equivalent diffusion coefficient as the particles. The hydrodynamic diameter may include factors not accounted for by other methods such as non-crystalline material on the surface of particles such as bulky surface ligands, amorphous regions of particles, and surface ligand-solvent interactions. Further, the hydrodynamic diameter may not accurately account for non-spherical particle shapes. DLS does have an advantage of being able to account for or more accurately model solution or suspension behavior of the particles compared to other techniques. In some embodiments, the particle size is determined by electron microscopy techniques such as scanning electron microscopy (SEM) or transmission electron microscopy (TEM).

In a preferred embodiment, the silver nanoparticles of the present disclosure substantially comprise elemental silver. The term "silver nanoparticle" as used herein refers to an elemental silver rich material (i.e. greater than 50%, more preferably greater than 60%, more preferably greater than 70%, more preferably greater than 75%, more preferably greater than 80%, more preferably greater than 85%, more preferably greater than 90%, more preferably greater than 95%, more preferably greater than 99% elemental silver by weight), which is disposed on the terraces of the silicon nanostructures.

In addition to elemental silver, various non-elemental silver materials including, but not limited to, silver alloys, metals and non-metals may be present in the silver nanoparticle. The total weight of these non-elemental silver materials relative to the total weight percentage of the silver nanoparticles is typically less than 30%, preferably less than 20%, preferably less than 15%, preferably less than 10%, more preferably less than 5%, more preferably less than 4%, more preferably less than 3%, more preferably less than 2%, more preferably less than 1%. Other ranges are also possible.

In addition to silver, it is envisaged that the present disclosure may be adapted to incorporate or comprise at least one additional plasmonic scattering metal (capable of surface plasmon resonance under light from 200-1100 nm) selected from the group consisting of gold, copper, aluminum, platinum, palladium, and alloys or mixtures thereof. These metals may be in the form of nanoparticles and may be randomly or non-randomly arranged as well as equally dispersed or unevenly dispersed amongst the silver nanoparticles of the present disclosure or in some embodiments fully substituted for the silver nanoparticles of the present disclosure. In a preferred embodiment, less than 60% of the nanoparticles are an additional plasmonic scattering metal, preferably less than 50%, preferably less than 40%, preferably less than 30%, preferably less than 25%, preferably less than 20%, preferably less than 15%, preferably less than 10%, preferably less than 5% of the nanoparticles are an additional plasmonic scattering metal. In a preferred embodiment, the nanoparticles of an additional plasmonic scattering metal would be generally subject to the same shape and size conditions of the silver nanoparticles described herein.

The silver nanoparticles and the silicon substrate as well as the silicon nanostructures may be attached to one another in any reasonable manner, preferably by highly connected or integral interactions (e.g. melted together, fused, amalgamated, annealed, etc.). In another embodiment, the nanoparticles may be disposed by adsorption defined as the adhesion of atom, ions or molecules to a surface creating a film of silver nanoparticles deposited on the silicon nanostructures. The attachment may refer to adsorption and/or chemical binding via strong atomic bonds (e.g. ionic, metallic and covalent bonds) and/or weak bonds (e.g. van der Waals forces or hydrogen binding). In one embodiment, the silver nanoparticles are physisorbed onto and/or within the terraces of the silicon nanostructures, leaving the chemical species of both materials intact. In a preferred embodiment, the plasmonic scattering nanomaterial of the present disclosure is substantially free of surfactants, ligands, capping reagents, binders and/or linkers and surface coatings that are often used to aid the immobilization or deposition of plasmonic scattering nanoparticles to substrate. For photovoltaic applications, nanoparticles need to be pure and free of residual surfactants, ligands, capping reagents, binders and/or linkers which might create possible exciton traps that are to be avoided.

In one embodiment, the silver nanoparticles may be disposed on the terraces of the silicon nanostructures or embedded in the silicon substrate. The silver nanoparticles may be affixed or deposited inside of and/or on an outer surface of the silicon nanostructures. The silver nanoparticles may be affixed to the silicon nanostructures in any reasonable manner, such as affixed to one or more surfaces of the terraces or alternately, at least partially embedded within the silicon nanostructures and/or additional void or pore spaces. In a preferred embodiment, the silver nanoparticles only contact the terraces of the silicon nanostructures.

In one embodiment, from 10-90% of the total volume and/or surface area of the silver nanoparticle is disposed on the terraces of the silicon nanostructures, preferably 10-80%, preferably 10-60%, preferably 10-40%, preferably 15-30%. In one embodiment, greater than 10% of the surface area (i.e. surface and pore spaces) of the silicon nanostructures is covered by silver nanoparticles, preferably greater than 15%, preferably greater than 20%, preferably greater than 25%, preferably greater than 30%, preferably greater than 35%, preferably greater than 40%, preferably greater than 45%, preferably greater than 50%, preferably greater than 55%, preferably greater than 60%, preferably greater than 65%, preferably greater than 70%, preferably great than 75% of the surface area of the silicon nanostructures is covered by silver nanoparticles. Other ranges are also possible.

In addition to a wide size distribution and disperse morphology, the coverage of silver nanoparticles may affect the plasmonic scattering of the nanomaterial. In some embodiments, the Ag-NPs on the SERS substrate have a coverage density of $1 \times 10^{10}$ to $7 \times 10^{10}$ particles $cm^{-2}$, preferably $2 \times 10^{10}$ to $6 \times 10^{10}$, preferably $3 \times 10^{10}$ to $4 \times 10^{10}$, or even preferably about $5 \times 10^{10}$. Other ranges are also possible.

As used herein, electromagnetic radiation may be considered to be "substantially" in a particular band of wavelengths if at least about 50%, about 75%, about 90%, about 95%, about 99%, and/or another percentage of the emitted electromagnetic radiation has a wavelength in the particular band of wavelengths. It may be preferred that more than about 90% of the spectral power is in the 400-800 nm band, and less than 10% power is above 600 nm. The electromagnetic intensity can be carried out on a LabRAM HR Evolution Raman microspectrometer system (30-4000 cm$^{-1}$). In one embodiment, HeNe laser kits of 633 nm (17 mW) is used as excitation source. In another embodiment, the intensity of the laser is adjusted to 50% to avoid sample damage and maintained the same power for all the measurements. In a further embodiment, a long working distance lens (50×) is used to focus the excitation on the sample and scattered photon is collected in backscattering configuration for 10 seconds and accumulation of 2 at a grating of 600 gr/mm. In some embodiments, the SERS substrate has an electromagnetic (EM) intensity of 2 to 20 volts per meter (V/m), preferably 4 to 18 V/m, preferably 6 to 16 V/m, preferably 8 to 14 V/m, or even more preferably 10 to 12 V/m. Other ranges are also possible.

Figure 7:
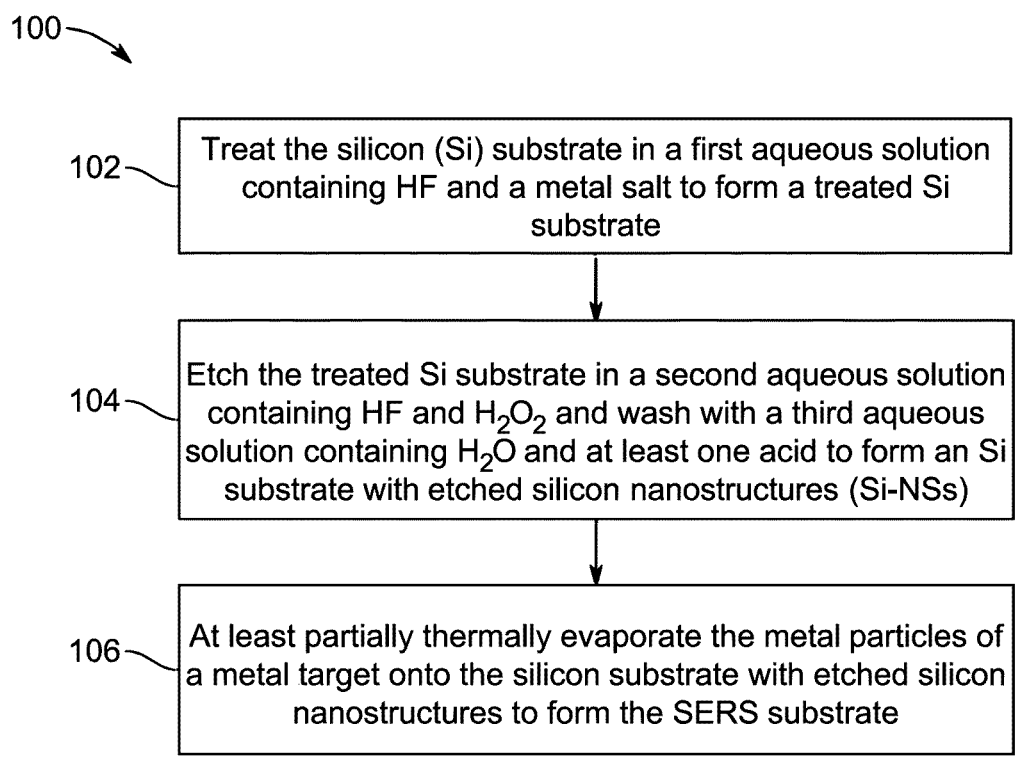
FIG. 7 is a schematic flow diagram of a method of preparing the SERS substrate, according to certain embodiments.

According to a second aspect, the present disclosure relates to a method of preparing the SERS substrate, as depicted in FIG. 7. The method 100 includes (i) treating the silicon (Si) substrate in a first aqueous solution containing HF and a metal salt to form a treated Si substrate, (ii) etching the treated Si substrate in a second aqueous solution containing HF and $H_2O_2$ and washing with a third aqueous solution containing $H_2O$ and at least one acid to form an Si substrate with etched silicon nanostructures (Si-NSs), and (iii) at least partially thermally evaporating the metal particles of a metal target onto the silicon substrate with etched silicon nanostructures to form the SERS substrate.

At step 102, the method 100 includes treating the silicon (Si) substrate in a first aqueous solution containing HF and a metal salt to form a treated Si substrate. In one embodiment, the silicon substrate is a p-type silicon wafer. In a further embodiment, the silicon substrate may contain monocrystalline silicon, polycrystalline silicon, amorphous silicon, or a combination thereof. In some even further embodiments, the silicon substrate may further comprise at least one semiconductor substrate selected from the group consisting of silicon, germanium, gallium, and arsenide.

In some embodiments, the silicon substrate may be supported on a solid support. In some embodiments, the solid support may be any suitable material known to one of ordinary skill in the art. Examples of the solid support include, but are not limited to silicon wafer, glass, thermoplastic, metal oxide such as ITO, transparent, opaque, porous, non-porous and any inert material that does not react with the porous oxide layer. In addition, examples of suitable solid support include, but are not limited to glass, sapphire, diamond, silicon, geranium, a binary semiconductor such as gallium arsenide, zinc sulfide, and cadmium selenide, a metal such as titanium, nickel, chromium, aluminum, and copper, and mixtures thereof.

In certain aspects, the silicon substrate may be cleaned prior to use in the method. Such cleaning may involve cleansing with a suitable solvent, for example ethanol, acetone, deionized water, or mixtures thereof. The cleaning may take place at room temperature. The cleaning may involve ultrasonication. The solid support used herein may have anti-reflective and self-cleaning properties. The solid support may be a glass support selected from the group consisting of glass, soda lime glass, borosilicate glass, aluminosilicate glass, lead glass, annealed glass, tempered glass, chemically strengthened glass, laminated glass, quartz, fluorine-doped tin oxide (FTO), indium tin oxide (ITO), and fused silica.

In some embodiments, the metal salt is at least one selected from the group consisting of a gold (Au) salt, a silver (Ag) salt, a copper (Cu) salt, a platinum (Pt) salt, an iron (Fe) salt, and a palladium (Pd) salt. In a preferred embodiment, the metal salt is a silver salt. In a further preferred embodiment, the silver salt comprises at least one selected from the group consisting of silver oxide, silver chromate, silver allantoinate, silver borate, silver glycerolate, silver nitrate, silver acetate, silver chloride, silver sulfate, silver lactate, silver bromide, silver iodide, silver carbonate, silver citrate, silver laurate, silver deoxycholate, silver salicylate, silver p-aminobenzoate, and/or silver p-aminosalicylate. In a more preferred embodiment, the silver salt is silver nitrate ($AgNO_3$).

As used herein, the term "normality," or "equivalent concentration" generally refers to the gram equivalent weight of a solute per liter of solution. The term is indicated using the symbol N, eq/L, or meq/L (=0.001 N) for units of concentration.

As used herein, the term "molarity," "amount concentration," or "substance concentration" generally refers to a measure of the concentration of a chemical species. The term indicates the number of moles per liter, having the unit symbol mol/L or mol/dm$^3$ in SI unit.

In some embodiments, the metal salt is present in the first aqueous solution at a concentration in a range of 0.005 to 0.1 N, preferably 0.01 to 0.05 N, preferably 0.015 to 0.03 N, or even more preferably about 0.02 N. In some embodiments, the HF is present in the first aqueous solution at a concentration in a range of 1 to 10 M, preferably 2 to 8 M, preferably 3 to 7 M, preferably 4 to 6 M, or even more preferably about 5 M. Other ranges are also possible.

In some embodiments, the first aqueous solution comprises a liquid selected from the group consisting of tap water, ground water, distilled water, deionized water, hard water, and fresh water. In some preferred embodiments, the first aqueous solution is a water solution, and the liquid may be deionized water, and/or distilled water. In some further preferred embodiments, the first aqueous solution may comprise water, i.e., at least 20, 30, 40, 50, 60, 70, 80, 90, 95, or 99 wt. % of a total weight of the first aqueous solution being water.

In some embodiments, the silicon substrate may be treated in the first aqueous solution at ambient temperature for 5 to 300 seconds, preferably 10 to 250 seconds, preferably 20 to 200 seconds, preferably 30 to 150 seconds, preferably 40 to 100 seconds, or even more preferably about 60 seconds. Other ranges are also possible.

At step 104, the method 100 includes etching the treated Si substrate in a second aqueous solution containing HF and $H_2O_2$ and washing with a third aqueous solution containing $H_2O$ and at least one acid to form an Si substrate with etched silicon nanostructures (Si-NSs).

As used herein, the term "etching" generally refers to the removal of material from a substrate or structures formed on the substrate by wet or dry chemical means. In some instances, wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the substrate.

In some embodiments, the HF is present in the second aqueous solution at a concentration in a range of 1 to 10 M, preferably 2 to 8 M, preferably 3 to 7 M, preferably 4 to 6 M, or even more preferably about 5 M. In some embodiments, the $H_2O_2$ is present in the second aqueous solution at a concentration of at least 10 wt. %, at least 20 wt. %, at least 30 wt. %, at least 40 wt. %, at least 50 wt. %, at least 60 wt.

% at least 70 wt. %, at least 80 wt. %, or at least 90 wt. % based on a total weight of the second aqueous solution. In some further embodiments, the $H_2O_2$ is present in the second aqueous solution at a concentration of no more than 95 wt. %, no more than 85 wt. %, no more than 75 wt. %, no more than 65 wt. %, no more than 55 wt. %, no more than 45 wt. %, no more than 35 wt. %, no more than 25 wt. %, or no more than 15 wt. % based on a total weight of the second aqueous solution. Other ranges are also possible.

In some embodiments, the treated Si substrate may be etched in the second aqueous solution at ambient temperature for 1 to 150 minutes, preferably 4 to 120 minutes, preferably 7 to 90 minutes, preferably 10 to 60 minutes, preferably 13 to 30 minutes, or even more preferably about 15 minutes. Other ranges are also possible.

In some embodiments, the acid present in the third aqueous solution comprises at least one selected from the group consisting of hydrochloric acid, sulfuric acid, phosphoric acid, nitric acid, acetic acid, boric acid, oxalic acid, citric acid, carbonic acid, perchloric acid, chlorous acid, nitrous acid, ethanoic acid, hypochlorous acid, and hydrocyanic acid. In some further embodiments, the acid comprises hydrochloric acid and nitric acid. In some preferred embodiments, a molar ratio of hydrochloric acid to nitric acid is in a range of 8:1 to 1:2, preferably 5:1 to 1:1, preferably 4:1 to 2:1, or even more preferably about 3:1. Other ranges are also possible.

In some embodiments, the second aqueous solution comprises a liquid selected from the group consisting of tap water, ground water, distilled water, deionized water, hard water, and fresh water. In some preferred embodiments, the second aqueous solution is a water solution, and the liquid may be deionized water, and/or distilled water. In some further preferred embodiments, the second aqueous solution may comprise water, i.e., at least 20, 30, 40, 50, 60, 70, 80, 90, 95, or 99 wt. % of a total weight of the second aqueous solution being water.

In some further embodiments, the third aqueous solution comprises a liquid selected from the group consisting of tap water, ground water, distilled water, deionized water, hard water, and fresh water. In some preferred embodiments, the third aqueous solution is a water solution, and the liquid may be deionized water, and/or distilled water. In some further preferred embodiments, the third aqueous solution may comprise water, i.e., at least 20, 30, 40, 50, 60, 70, 80, 90, 95, or 99 wt. % of a total weight of the third aqueous solution being water.

At step 106, the method 100 includes at least partially thermally evaporating the metal particles of a metal target onto the silicon substrate with etched silicon nanostructures to form the SERS substrate. As used herein, the term "thermal evaporation," "thermally evaporating" or other similar terms generally refer to a vacuum deposition process in which electrical energy is used to heat a filament which in turn heats a deposition material to the point of evaporation.

In some embodiments, the metal particles of the metal target are thermally evaporated onto the silicon substrate with etched silicon nanostructures at a temperature of 700 to 1500° C., preferably 800 to 1400° C. preferably 900 to 1300° C., preferably 1000 to 1200° C., or even more preferably 1100° C. at a power of 0.1 to 2 amperes (A) per milligram of the metal target, preferably 0.3 to 1.8, preferably 0.5 to 1.6, preferably 0.7 to 1.4, preferably 0.9 to 1.2, or even more preferably 1.0 ampere per milligram of the metal target. Other ranges are also possible.

In some embodiments, thermally evaporating the metal is carried out in a container made by a material selected from the group consisting of a tungsten, a tantalum, an alloy of tungsten and aluminum oxide. In some preferred embodiments, the thermally evaporating is conducted in a tungsten basket.

In some embodiments, the thermally evaporating the metal may be carried out in a chamber of a thermal evaporation system, i.e., Quorum K975X. In some embodiments, a base pressure of the evaporating in the chamber is maintained at $1 \times 10^{-6}$ to $20 \times 10^{-6}$ torr, preferably $3 \times 10^{-6}$ to $15 \times 10^{-6}$ torr, preferably $6 \times 10^{-6}$ to $12 \times 10^{-6}$ torr, or even preferably about $9 \times 10^{-6}$ torr. In some embodiments, a distance between the metal target and the silicon substrate is in a range of 1 to 20 centimeters (cm), preferably 4 to 16 cm, preferably 8 to 12 cm, or even preferably about 10 cm. Other ranges are also possible.

In some embodiments, the metal particles are silver particles, and the metal target is silver. In some further embodiments, the metal target may further comprise Al, Ni, Cr, Au, In.

According to a third aspect, the present disclosure relates to a method for measuring surface enhanced Raman scattering (SERS) signal of an analyte. The method includes (i) contacting the analyte with the SERS substrate prepared by the method 100 to form a sample, (ii) exposing the sample to laser light such that a portion of the laser light is scattered by the sample to form scattered light, (iii) detecting the scattered light. In some embodiments, the analyte has a Raman scattering signal that is enhanced relative to that of the analyte without contacting with the SERS substrate.

The scattered Raman signal (photon) is collected through a slit in a backscattering configuration. The proportional relationship between Raman scattering intensity and analyte concentration is used to perform quantitative analysis.

In some embodiments, the analyte comprises at least one molecule selected from the group consisting of a synthetic molecule, a protein, a deoxyribonucleic acid sequence, a ribonucleic acid sequence, an amino acid, a peptide, a nucleotide, a nucleoside, and a neurotransmitter. In some preferred embodiments, the analyte comprises Rhodamine 6G.

In some further preferred embodiments, the laser light has a wavelength of 600 to 650 nm, and the SERS substrate has an enhancement factor of $3 \times 10^5$ to $50 \times 10^5$. In some embodiments, the laser light has a wavelength of 605 to 645 nm, preferably 610 to 640 nm, preferably 615 to 635 nm, preferably 620 to 630 nm, preferably 625 nm. In some embodiments, the SERS substrate has an enhancement factor of at least $3 \times 10^5$, at least $10 \times 10^5$, at least $20 \times 10^5$, at least $30 \times 10^5$, or at least $40 \times 10^5$. In some other embodiments, the SERS substrate has an enhancement factor of no more than $50 \times 10^5$, no more than $40 \times 10^5$, no more than $30 \times 10^5$, no more than $20 \times 10^5$, or no more than $10 \times 10^5$. Other ranges are also possible.

The examples below are intended to further illustrate protocols for preparing, characterizing, and using the SERS substrate and for performing the method described above and are not intended to limit the scope of the claims.

Where a numerical limit or range is stated herein, the endpoints are included. Also, all values and subranges within a numerical limit or range are specifically included as if explicitly written out.

Examples

The following examples describe and demonstrate a method for making a SERS substrate described herein. The examples are provided solely for illustration and are not to be construed as limitations of the present disclosure, as many variations thereof are possible without departing from the spirit and scope of the present disclosure.

Example 1: Si-NSs and Ag-NPs-Decorated Terraces in Si-NSs

Metal catalyzed electroless etching is one of the popular and well-reported technique to etch Si and achieve Si-NSs. As stated above, there are extensive studies in this regard and almost all the reports tried to achieve vertically aligned Si-NWs. However, as SERS-active substrate, the underlying platform requires a large number of SHSs and in such scenario, vertically aligned Si-NWs were not able to support the needful. The inherent features of metal catalyst, particularly shapes and sizes play crucial role in defining the nanostructures during etching of silicon [B. Salhi, M. K. Hossain, A. W. Mukhaimer, and F. A Al-Sulaiman. "Nanowires: a new pathway to nanotechnology-based applications." Journal of electroceramics 37, no. 1 (2016): 34-49.]. Therefore, metal catalysts of arbitrary shapes and low gap distribution was achieved to fabricate Si-NSs that consisted of wide and open valleys. Detailed topographic investigation was carried out and explained in later part of the text.

A fabrication schematic is shown in FIG. 1. Silver nitrate ($AgNO_3$ 99.8%), ($H_2O_2$ 30% in water), $H_2SO_4$ 98%, (HF 48%) were purchased from HACH, Scharlau and Applichem Panreac respectively. A p-type silicon wafer was used as base material to achieve the Si-NSs. The wafer was treated by several chemicals for cleaning and etching [Mohammad Kamal Hossain, Billel Salhi, and Ayman Mukhaimar. "Fabrication and Spectral Characteristics of Silicon Nanowires for Efficient Solar Energy Harvesting." Plasmonics 16, no. 1 (2021): 1-8—incorporated herein by reference]. The wafer was catalyzed in an aqueous solution of $HF/AgNO_3$ (5M/0.02N) for 1 min. As for etching, the wafer was immersed in an etching solution of $HF/H_2O_2$ (5M/30%) for 15 mins. An aqua-regia acid solution in water, $H_2O:HCl:HNO_3$ was used to remove the residual Ag from the etched Si-NSs. Finally, the wafer was transferred to a vacuum chamber for thermal evaporation (model #Quorum K975X) of Ag on the Si-NSs. The wafer was kept 10 cm away from the source and a tungsten basket was used to evaporate Ag wire of 10 mg at current of 10 A. Topographic confirmation and in-depth morphology of Si-NSs and Ag-NPs-decorated Si-NSs were carried out using high-resolution FESEM (model #Tescan LYRA3).

Example 2: SERS Set-Up

SERS measurements were carried out using LabRAM HR Evolution Raman microspectrometer system (30-4000 $cm^{-1}$). Detailed SERS set-up can be found [Kabiru Haruna, Tawfik A. Saleh, Mohammad Kamal Hossain, and Abdulaziz A. Al-Saadi. "Hydroxylamine reduced silver colloid for naphthalene and phenanthrene detection using surface-enhanced Raman spectroscopy." Chemical Engineering Journal 304 (2016): 141-148—incorporated herein by reference]. In brief, HeNe laser kits of 633 nm (17 mW) was used as excitation source. The intensity of the laser was adjusted to 50% to avoid sample damage and maintained the same power for all the measurements. A long working distance lens (50×) was used to focus the excitation on the sample and scattered photon was collected in backscattering configuration for sec. and accumulation of 2 at a grating of 600 gr/mm. A standard Raman-active dye R6G was received from Chroma GesellschaftSchmid GMBH & Co and used without any further treatment. As-fabricated Si-NSs and Ag-NPs-decorated Si-NSs were incubated by R6G dye of 0.2 M and $1 \times 10^{-6}$ M respectively for ca. 10 mins. The sample was washed with deionized water copiously before the SERS measurements.

Example 3: FDTd Simulation

Figure 2D:
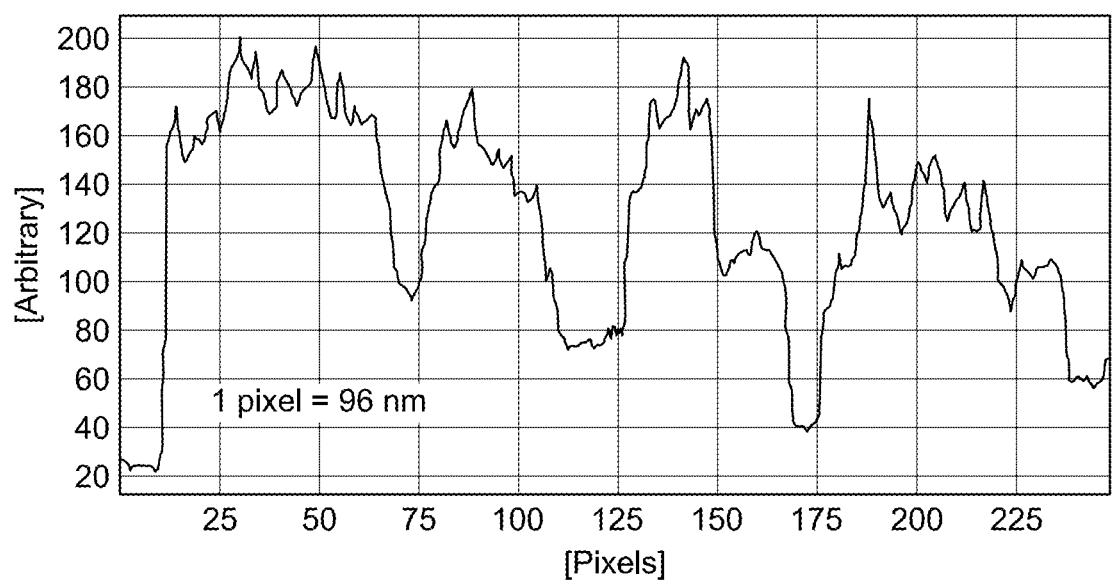
FIG. 2D illustrates a line profile along the dotted line crossing as-fabricated Si-NSs as shown in FIG. 2B confirming the hills and valleys that contain different dimensions of terraces, according to certain embodiments.
Figure 2F:
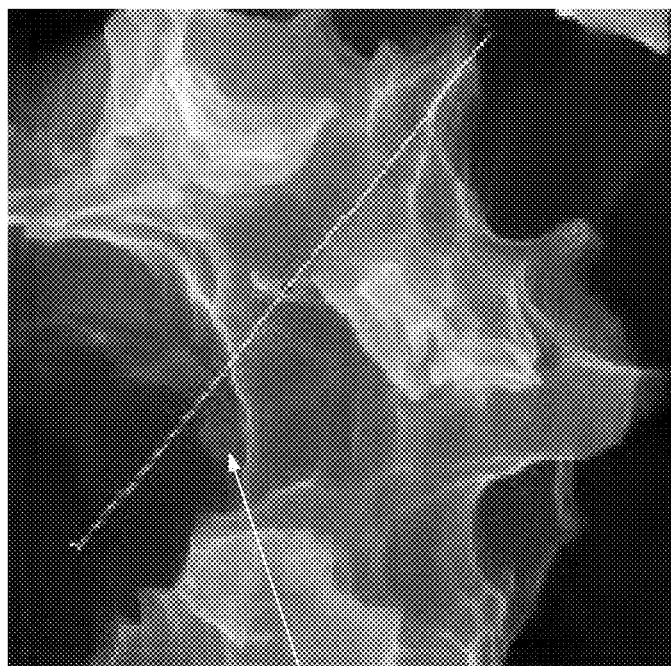
FIG. 2F illustrates a magnified view of an area (5 nm×5 nm) as marked by the dotted square in FIG. 2E, according to certain embodiments.
Figure 2E:
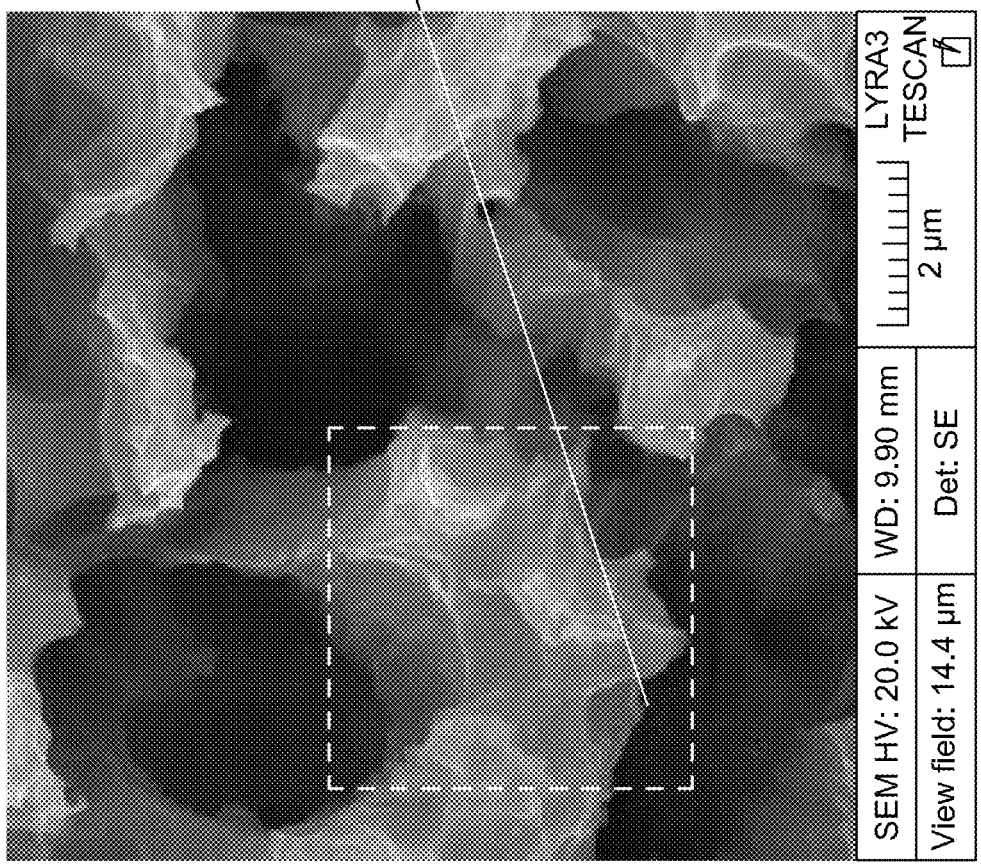
FIG. 2E illustrates a high-resolution FESEM micrograph of the Si-NSs, according to certain embodiments.
Figure 2G:
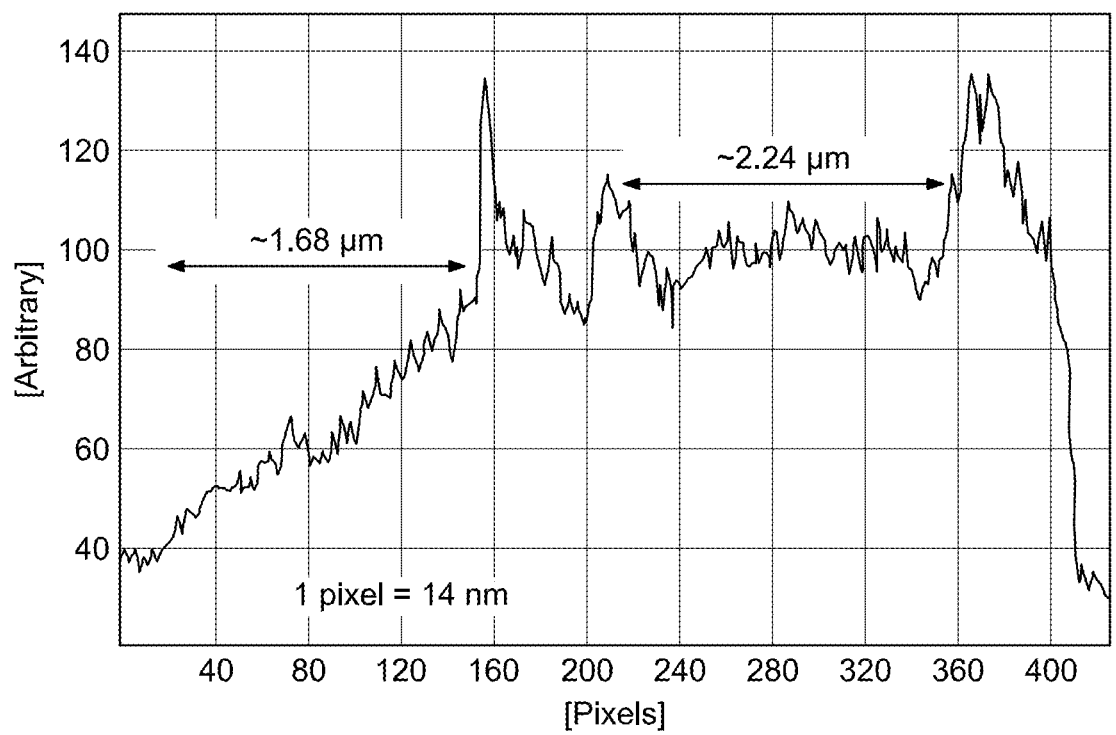
FIG. 2G illustrates a line profile along the dotted line crossing as-fabricated Si-NSs as shown in FIG. 2F confirming the variations in sizes and shapes of terraces, according to certain embodiments.

As stated earlier, EM near-field distribution is the main ingredient for giant SERS enhancement. Therefore, it is useful to understand the characteristics of EM near-field distributions for specific SERS-active platform. In this context, three specific models were developed for FDTD analysis and EM near-field distributions were extracted using a Maxwell equations solver, PLANC-FDTD (Information and Mathematical Science Laboratory Inc., Ver. 6.2). In the first model, dimer of Ag-NPs of 30 nm diameter each was used and EM near-field distributions were analyzed for s-, p- and 45° of incident polarizations. In the second model, the dimer of Ag-NPs of 40 and 20 nm diameter each was developed and EM near-field distributions were extracted for s-, p- and 45° of incident polarizations. In the third model, a linear trimer of Ag-NPs of 40, 20 and 30 nm diameter each was designed and EM near-field distributions were demonstrated for s-, p- and 45° of incident polarizations. Although the constituent Ag-NPs were distinct from each other, notably in size and form, as revealed in FESEM examinations, nanoobjects were deemed smooth and ordered in a periodic pattern for the purpose of simplicity Example 4: Topographic Confirmation Understanding the nanoscale geometry of plasmonic SERS-active platform with utmost accuracy is advantageous for SERS study. It has been reported previously that a small change in local geometry of SHSs leads to a huge degree of variation in inducing EM near-field distributions. In this context, the as-fabricated Si-NSs and Ag-NPs-decorated Si-NSs were thoroughly investigated by high-resolution FESEM. FIG. 2A shows an FESEM micrograph of the Si-NSs. A zoom-in view of the same image has been further investigated as shown in FIG. 2B. FIG. 2B represents a magnified view (20 µm×20 µm) as marked by the white dotted square in FIG. 2A. The as-fabricated Si-NSs were found to be full of microscale valleys of different sizes and openings as shown by a 3D hawk-eye in FIG. 2C. A line profile along the white dotted line as shown in FIG. 2B was shown in FIG. 2D. The dips and hills and the distances between such dips and hills clarified further that the microscale valleys were wide and open. Within such valleys, multitude of surface area was speculated to be available in small area that can hold abundant SHSs upon decoration. Indeed, terraces of wide and open exposure within the Si-NSs was observed as shown in FIG. 2E. FIG. 2E represents a high-resolution FESEM micrograph of the same NSs consisted of terraces in different levels in nanoscale. Further magnified view of the same Si-NSs revealed terraces of micrometer length. FIG. 2F shows a zoom-in view of the area (5 µm×5 µm) as marked by the white dashed square in FIG. 2E. Terraces of difference areas were observed as shown in FIG. 2F. Approximate lengths of typical terraces were estimated following a line profile as shown in FIG. 2G. FIG. 2G displays a line profile along the white dotted line as indicated in FIG. 2F. Two typical terraces of ~1.68 µm and ~2.24 µm were marked therein by double sided arrows in FIG. 2F. As stated earlier, such terraces can be decorated with appropriate metal nanoparticles and strong enhancement in SERS signal can be achieved.

Figure 3D:
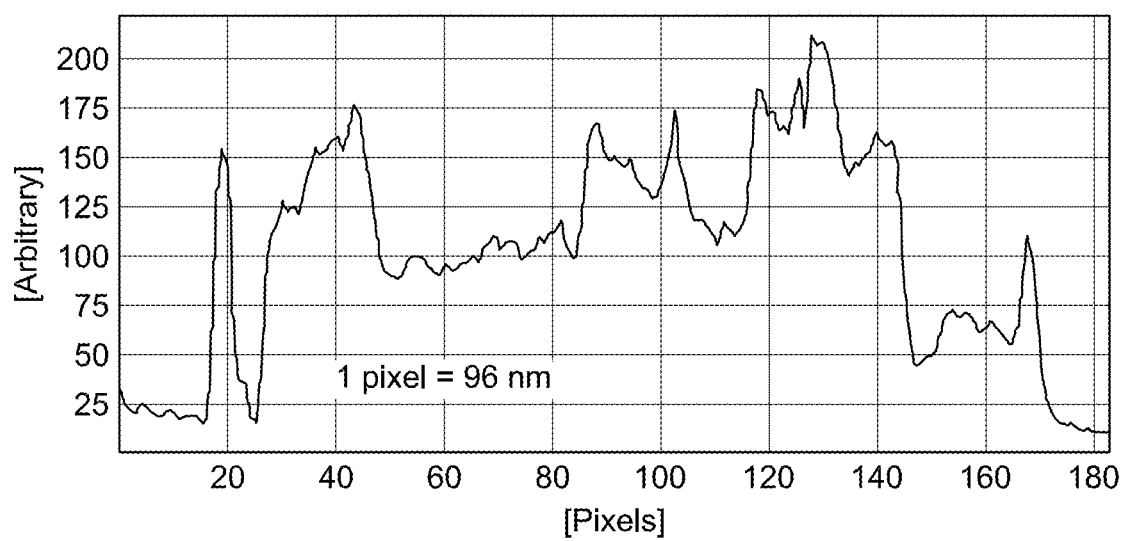
FIG. 3D illustrates a line profile along the dotted line crossing Ag-NPs-decorated terraces in Si-NSs as shown in FIG. 3B confirming the hills and valleys that contain different dimensions of terraces, according to certain embodiments.
Figure 3F:
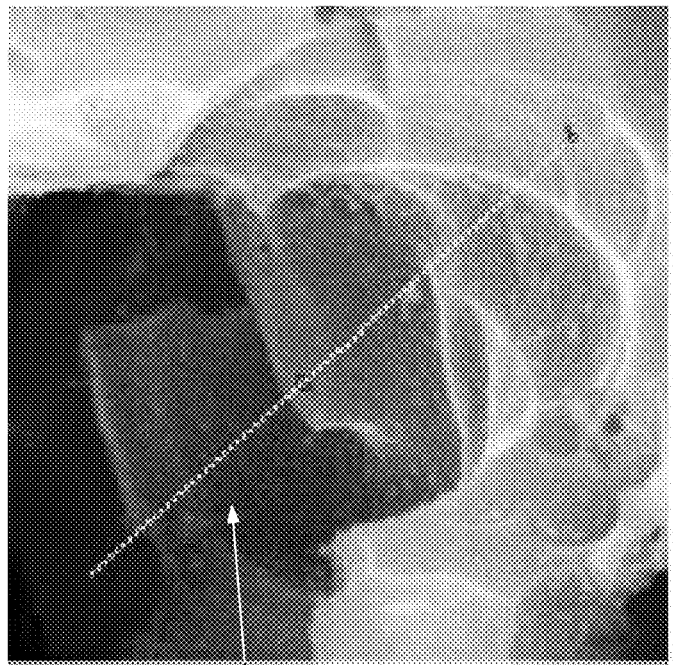
FIG. 3F illustrates a magnified view of an area (5 μm×5 μm) as marked by the dotted square in FIG. 3E, according to certain embodiments.
Figure 3E:
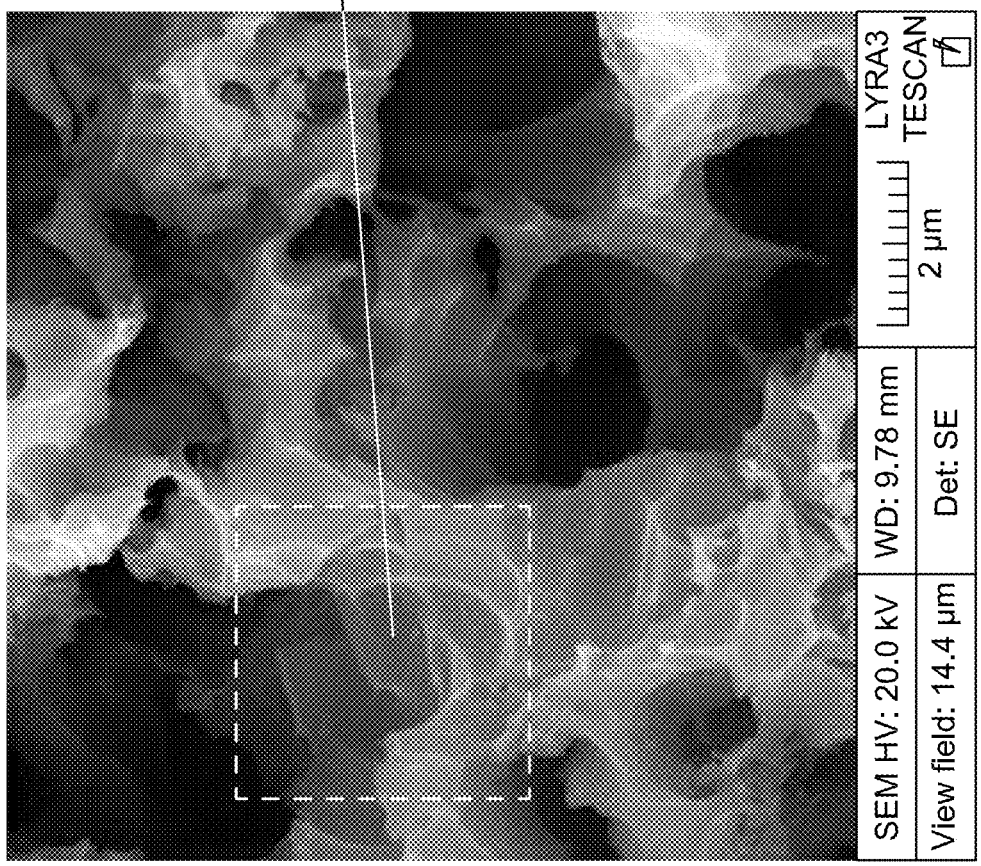
FIG. 3E illustrates a high-resolution FESEM micrograph of Ag-NPs-decorated terraces in Si-NSs, according to certain embodiments.
Figure 3G:
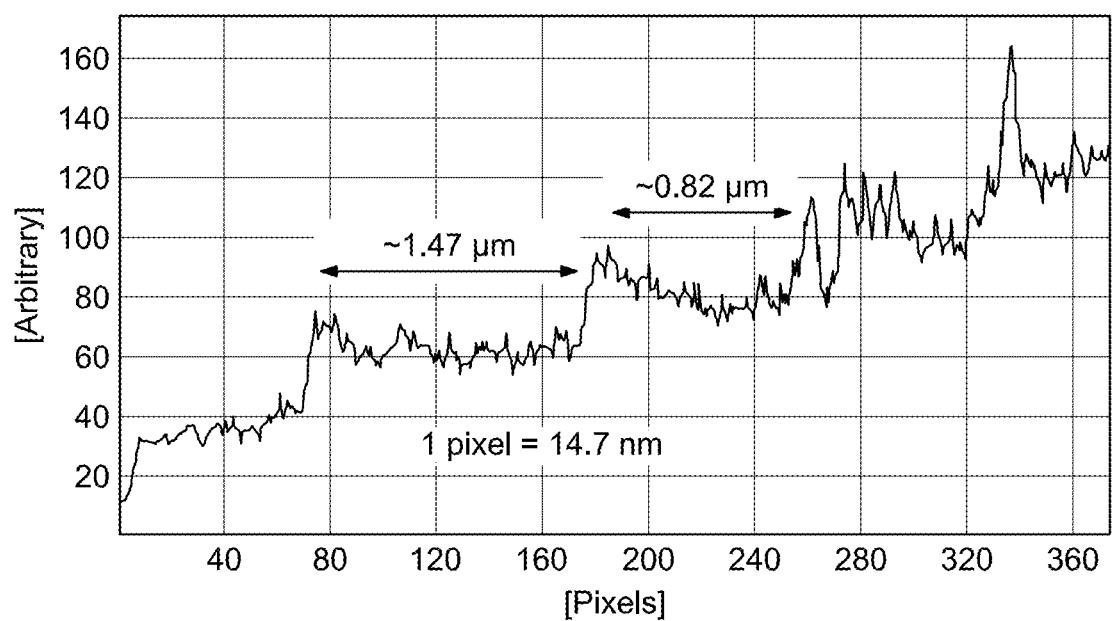
FIG. 3G illustrates a line profile along the dotted line crossing Ag-NPs-decorated terraces in Si-NSs as shown in FIG. 3F confirming the variation in sizes and shapes of terraces, according to certain embodiments.

FIG. 3A shows FESEM micrograph of Ag-NPs-decorated terraces available in Si-NSs. A zoom-in view as shown in FIG. 3B represents a magnified view (20 μm×20 μm) as marked by the white dashed square in FIG. 3A. Similar to that as observed in pristine Si-NSs, Ag-NPs-decorated Si-NSs were found to be full of microscale valleys of different sizes and openings as confirmed by a 3D hawk-eye view as shown in FIG. 3C. A line profile along the white dotted line as shown in FIG. 3B is displayed in FIG. 3D. The dips and hills and the distances between such dips and hills clarified further that the microscale valleys were wide and open. Valleys of different sizes and shapes were observed as shown in FIG. 3E. FIG. 3E represents a high-resolution FESEM micrograph of the same Ag-NPs-decorated Si-NSs consisted of terraces in different steps in microscale valleys. Further magnified view of the same Ag-NPs-decorated Si-NSs revealed terraces of micrometer length. FIG. 3F shows a zoom-in view of the area (5 μm×5 μm) as marked by the white dashed square in FIG. 3E. Terraces of difference areas were observed as shown in FIG. 3F. Approximate lengths of typical terraces were estimated following a line profile as shown in FIG. 3G. FIG. 3G displays a line profile along the white dotted line as indicated in FIG. 3F. Two typical terraces of ~1.47 μm and ~0.82 μm were marked therein by double sided arrows in FIG. 3F. Such terraces of micrometer lengths can have millions of NPs at the top, although the FESEM micrographs was not able to clearly depict such scenario in this regard. In this context, a high-resolution FESEM investigations with sufficient high magnification indicated the existence of Ag-NPs available in Ag-NPs-decorated terraces of Si-NSs.

Figure 4D:
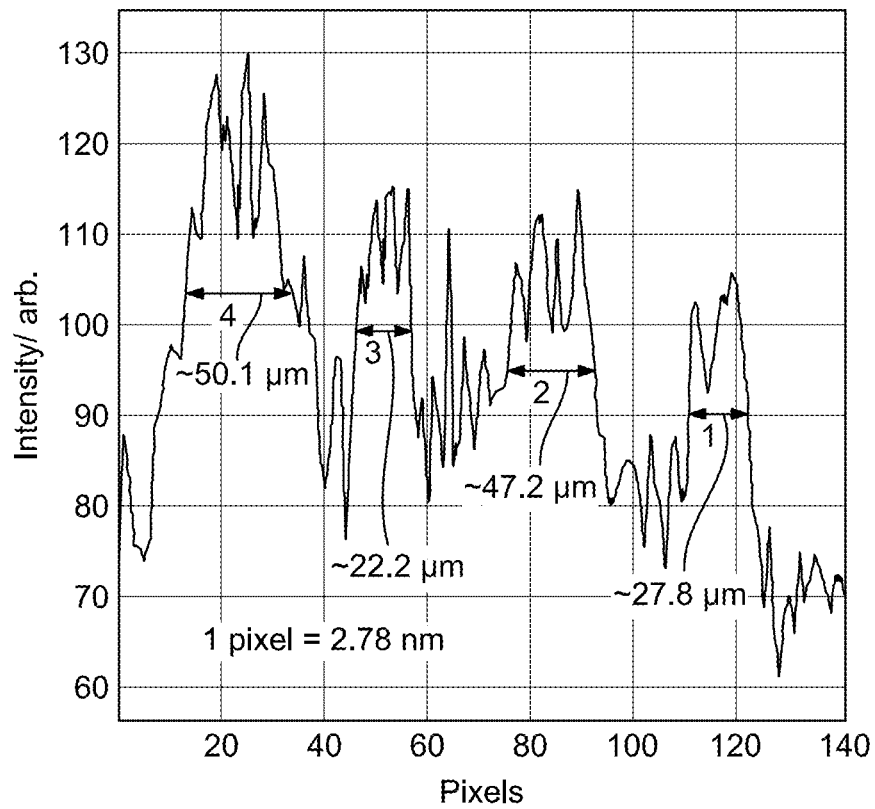
FIG. 4D illustrates a line profile along the dotted line crossing four typical Ag-NPs as shown in FIG. 4B, according to certain embodiments.
Figure 4E:
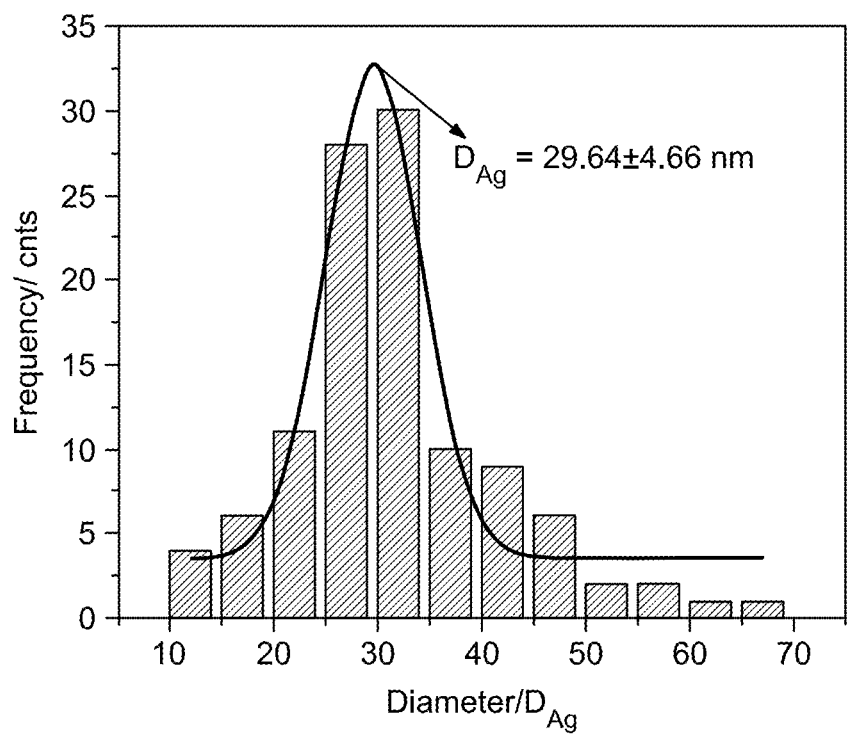
FIG. 4E illustrates size distribution (bar graph) of Ag-NPs along with Gaussian fit (curve), according to certain embodiments.

FIG. 4A shows a high-resolution FESEM micrograph of Ag-NPs-decorated terraces of Si-NSs. It is noteworthy that surface of the Si-NSs was decorated with Ag-NPs of different sizes and shapes. FIG. 4B represents a magnified view (500 nm×500 nm) as marked by the white dotted square in FIG. 4A. A line profile along the white dotted line in FIG. 4B was shown in FIG. 4D. Four typical Ag-NPs as marked by "1", "2", "3" and "4" in FIG. 4B were estimated to be ~27.8, ~47.2, ~22.2 and ~50.1 nm respectively as shown in FIG. 4D. High-resolution FESEM micrograph also supported that the Ag-NPs used to decorate Si-NSs was indeed of different sizes and shapes. FIG. 4C shows a zoom-in view (500 nm×500 nm) of the white dashed square as marked in FIG. 4A. Three typical Ag-NPs of ~16, ~38 and ~75 nm in diameters were shown by white dotted circle in FIG. 4C. Based on more than 150 events as observed in high-resolution FESEM micrograph, a size distribution was estimated. FIG. 4E shows a histogram of size distribution of Ag-NPs along with the Gaussian fit in red. As shown in FIG. 4E, a relatively narrow size distribution, 29.64±4.66 nm using the Gaussian fit (in red) was estimated. The narrow full width at half maximum (FWHM) of 4.66 nm inferred that as-fabricated Ag-NPs were mostly uniform in size. As stated earlier, Ag-NPs of different sizes and shapes facilitate higher EM near-field distribution and thus enhanced Raman signal is expected. At the same time, the population of the higher EM near-field distribution enriches the quality of the ensemble SERS enhancement.

Example 5: SERS-Activity

In SERS-activity, the target analyte needs to be as close as possible to SHSs [Mohammad Kamal Hossain. "Surface-enhanced Raman scattering: a technique of choice for molecular detection." In Materials Science Forum, vol. 754 (2013):143-169; Mohammad Kamal Hossain, Yasutaka Kitahama, Genin Gary Huang, Xiaoxia Han, and Yukihiro Ozaki. "Surface-enhanced Raman scattering: realization of localized surface plasmon resonance using unique substrates and methods." Analytical and bioanalytical chemistry 394, no. 7 (2009): 1747-1760; Mohammad Kamal Hossain, and Yukihiro Ozaki. "Surface-enhanced Raman scattering: facts and inline trends." Current Science (00113891) 97, no. 2 (2009)]. SHSs facilitate EM near-field confinements by 2 to 5 orders. Interestingly, this enhanced EM near-field supports both excitation and emitted radiation to be energized leading to SERS intensity as per the fourth power of field enhancement. Detailed mechanism, known as two-fold enhancement, has been explained in later part of the text. The "lightening rod" effect makes 1D-nanostructures more advantageous in localizing EM near-field distributions at two distinct places, whereas isolated spherical plasmonic nanoparticles have smaller EM near-field distributions. However, as compared to isolated nanoparticles or nanorods, 2D assemblies have been shown to have more EM near-field distribution locations. On the contrary, 3D nanostructures such as Si-NSs provide even higher specific area to possess SHSs in different planes. Therefore, it is important to have higher population of SERS-active interstitials (synonymously known as SHSs) as was demonstrated in Ag-NPs-decorated terraces of Si-NSs in FIG. 3 and FIG. 4.

Figure 5A:
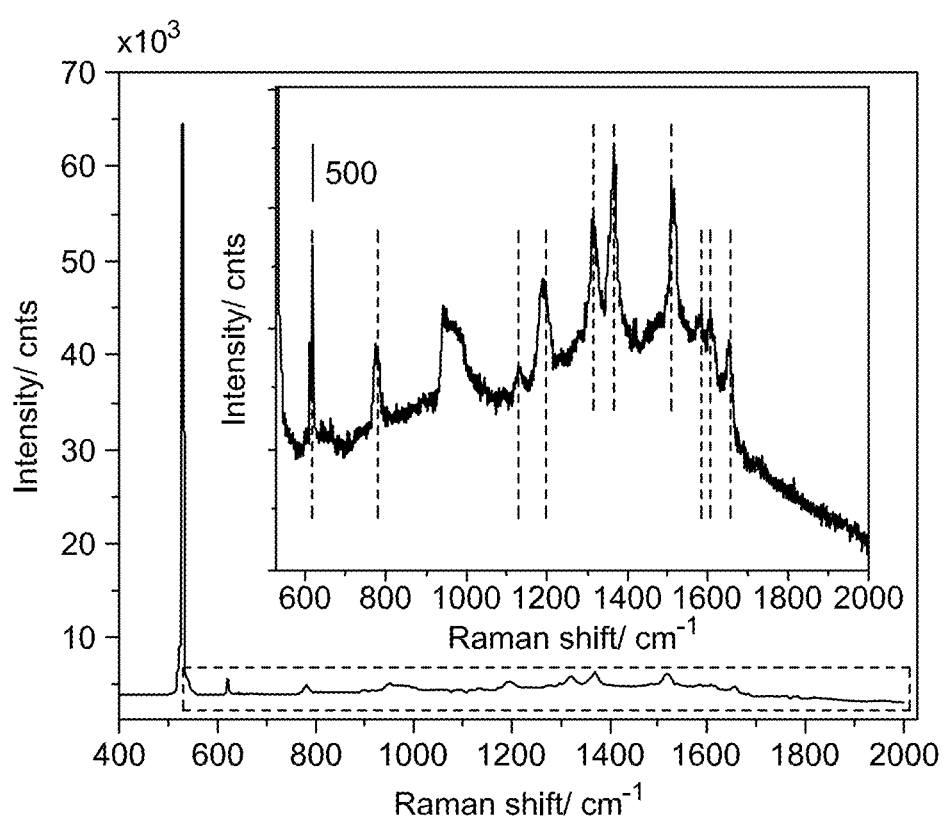
FIG. 5A illustrates a SERS spectrum of R6G adsorbed on Ag-NPs-decorated Si-NSs, (i)-(ii) a magnified view of two small areas of interest showing diffraction limited Ag-NPs decoration, according to certain embodiments.

FIG. 5A shows the SERS spectrum of R6G adsorbed on Ag-NPs-decorated Si-NSs excited by 633 nm. Ten SERS bands of R6G was noted as shown in inset of FIG. 5A. Inset of FIG. 5A represents selected area of the spectrum as marked by the black dashed rectangle in FIG. 5A. The SERS bands of R6G as observed in this case was marked by the red vertical dashed lines therein. SERS spectrum of R6G molecules acquired from Ag-NPs-decorated Si-NSs exhibited strong intensities at 610, 769, 1120, 1182, 1310, 1361, 1508, 1571, 1595 and 1648 $cm^{-1}$ wavenumbers as marked by red vertical dashed lines in FIG. 5A. As stated in table 1, 610, 769, 1120, 1182 and 1310 $cm^{-1}$ wavenumbers represent C—C ring bending mode (in-plane) in phenyl rings, C—H bending mode (out-of-plane), C—H bending mode (in plane) xanthene/phenyl rings, C—H bending mode (in-plane) in xanthene ring, C—C Hybrid stretching mode in xanthene/phenyl rings and NHC2H5 group respectively. Bands at 1361, 1508, 1571, 1595 and 1648 $cm^{-1}$ wavenumbers correspond to the aromatic stretching vibration modes.

Figure 5B:
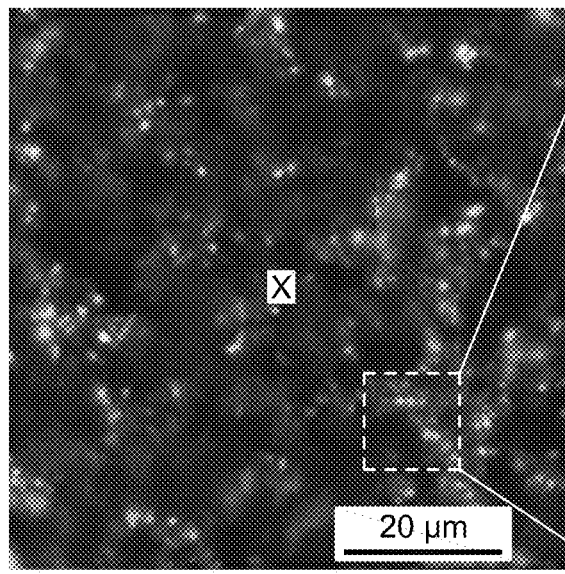
FIG. 5B illustrates a bright-field microscopic image of the same indicating the spot of interest in acquiring SERS spectrum marked as the "x" therein, according to certain embodiments.
Figure 5D:
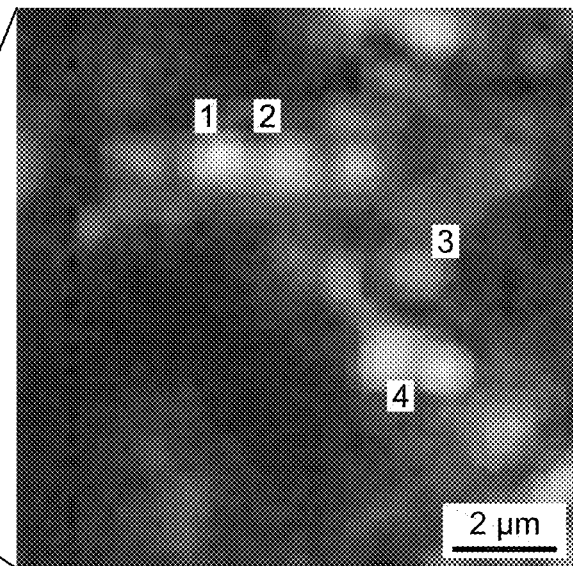
FIG. 5D illustrates SERS bands on corresponding band assignment of R6G adsorbed on Ag-NPs-decorated Si-NSs, according to certain embodiments.
Figure 5C:
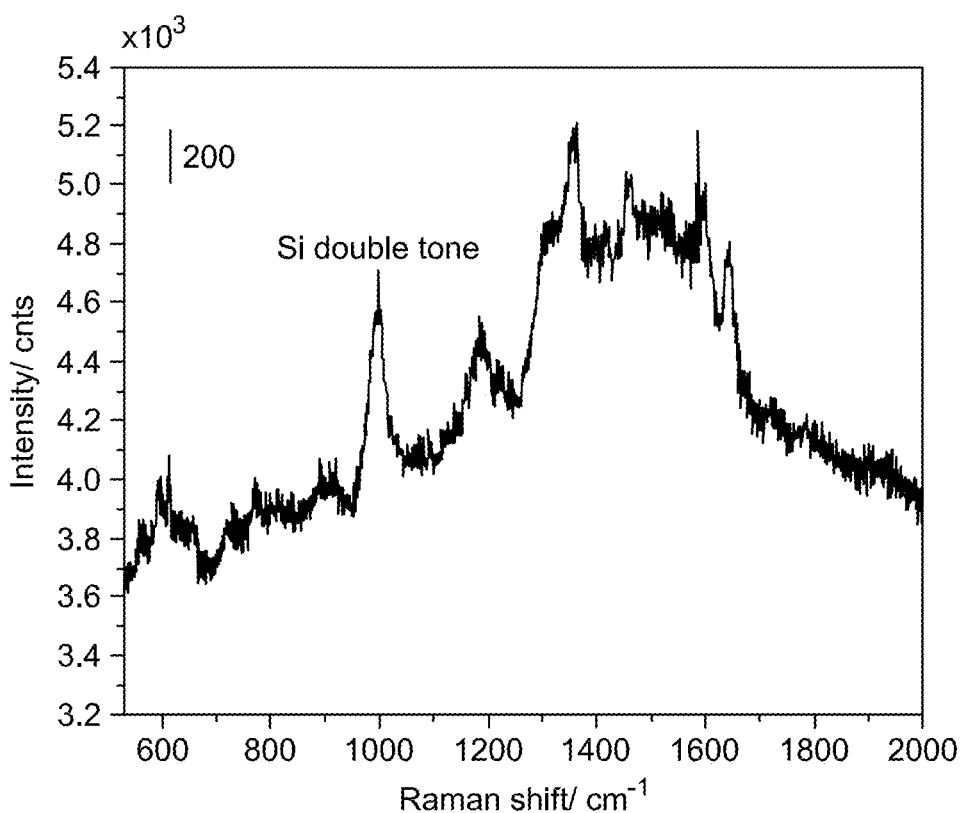
FIG. 5C illustrates a Raman spectrum of R6G adsorbed on as-fabricated Si-NSs, according to certain embodiments.

FIG. 5B displays a CCD image of the same specimen with a white "x" indicating the focusing point. Due to the modest intensity and exposure of laser excitation, no damage or dissociation of R6G dyes was observed. The laser was switched off immediately after the measurement, as previously stated, without moving the focusing spot on the same object. The true color CCD image revealed the possible sites of plasmon-active Ag aggregates as shown in FIG. 5D. FIG. 5D shows zoom-in views of a small area marked by the white dashed square in FIG. 5b along with four typical sites "1", "2", "3" and "4". The color variation of the CCD image indicated that Ag aggregates were different in nature and thus speculated to induce EM near-field differently. FIG. 5C displays Raman spectrum of R6G of 0.2 M adsorbed on Si-NSs only. Table 1 lists the SERS bands observed during this investigation, as well as the band assignments that corresponded to reported SERS peaks of R6G. As previously stated, the EM enhancement mechanism is the most important aspect in SERS enhancement, hence it was hypothesized that EM near-field dispersion in Ag-NPs-decorated Si-NSs aided increased SERS enhancement. As noted earlier in the experimental part, extensive simulations were carried out to extract EM near-field distributions for three specific Ag-NPs models.

TABLE 1

SERS bands of R6G, corresponding band assignments and estimated EF for individual bands in presence of Ag-NPs-decorated Si-NSs

| SERS Band of R6G (cm$^{-1}$) | Band Assignments | EF |
|---|---|---|
| 610 | C—C ring bending (in-plane) in phenyl rings | ~1.71 × 10$^6$ |
| 769 | C—H bending (out-of-plane) | ~1.17 × 10$^6$ |
| 1120 | C—H bending (in plane) xanthene/phenyl rings | ~3.70 × 10$^6$ |
| 1182 | C—H bending (in-plane) in xanthene ring | ~7.20 × 10$^5$ |
| 1310 | C—C Hybrid stretching in xanthene/phenyl rings and NHC$_2$H$_5$ group | ~3.93 × 10$^6$ |
| 1361 | C—C stretching in xanthene ring | ~8.08 × 10$^5$ |
| 1508 | C—C stretching in xanthene ring | ~4.28 × 10$^6$ |
| 1571 | C—C stretching in phenyl ring | ~7.55 × 10$^5$ |
| 1595 | C—C stretching in phenyl ring | ~4.36 × 10$^5$ |
| 1648 | C—C stretching in xanthene ring | ~3.81 × 10$^5$ |

SERS enhancement factor (EF) of R6G adsorbed on Ag-NPs-decorated Si-NSs has been carried out. As shown in FIG. 5, ten SERS bands were observed in each scenario and therefore, considering the SERS band and Raman bands of R6G, EF was estimated and compared for individual ten bands. EF was calculated using the following formula, $$EF = \left(\frac{I_{SERS}}{I_{bulk}}\right) \times \left(\frac{C_{bulk}}{C_{SERS}}\right) \quad (1)$$

whereas, $I_{SERS}$ and $I_{bulk}$, represent intensities of SERS and Raman measurements at a specific vibrational mode respectively. $C_{SERS}$ and $C_{bulk}$ represent the molarities of molecules used in SERS and Raman measurements respectively.

As shown in Table 1, the SERS enhancements for R6G at the band of 610, 769, 1120, 1182, 1310, 1361, 1508, 1571, 1595 and 1648 cm$^{-1}$ wavenumbers were estimated to be ~1.71×10$^6$, ~1.17×10$^6$, ~3.70×10$^6$, ~7.20×10$^5$, ~3.93×10$^6$, ~8.08×10$^5$, ~4.28×10$^6$, ~7.55×10$^5$, ~4.36×10$^5$, and ~3.81×10$^5$ respectively. It was noteworthy that Si double tone mode was observed at ~933-996 cm$^{-1}$.

Example 6: EM Near-Field Distributions

In SERS enhancement, there is a contribution from charge transfer (CT) mechanism in most of the scenario. However, the EM mechanism is known to be dominant and several orders higher, particularly for metal-based plasmonic SERS-active substrate. Pittinger et al. proposed the EM mechanism evidenced by twofold EM enhancement in 1986, and it has since become the basic mechanism of EM enhancement in the SERS process. In brief, the twofold EM enhancement happens in two subsequent processes as shown in equation 2. In the first process, EM near-field enhances Raman scattering of the analyte, whereas the scattered Raman signal get enhanced further in the second [55-59]. The enhancement factor, EF is denoted by $$EF = \left|\frac{E_L(\lambda_I)}{E_I(\lambda_I)}\right|^2 \times \left|\frac{E_L(\lambda_I \pm \lambda_R)}{E_I(\lambda_I \pm \lambda_R)}\right|^2 = EF_1(\lambda_I) \times EF_2(\lambda_I \pm \lambda_R) \quad (2)$$

where $E_I$ and $E_L$ are the incident and local electric fields respectively, $\lambda_I$ is the excitation wavelength, +$\lambda_R$ and $-\lambda_R$ are the wavelengths of the anti-Stokes and Stokes Raman shifts, respectively, an $EF_1$ and $EF_2$ are the first and second enhancement factors, respectively Now we are in the position to elucidate EM near-field distributions extracted from FDTD analysis for archetype models as shown in FIG. 6. Three typical models: i) a dimer of Ag-NPs of nm diameter each, ii) a dimer of Ag-NPs of 40 and 20 nm diameter and iii) a trimer of Ag-NPs of 40, 20 and 30 nm diameter were designed and simulated for s-, p- and 45° of incident polarizations. Excitation of 633 nm that was normal to the geometries was used as per the experimental conditions.

Figure 6A:
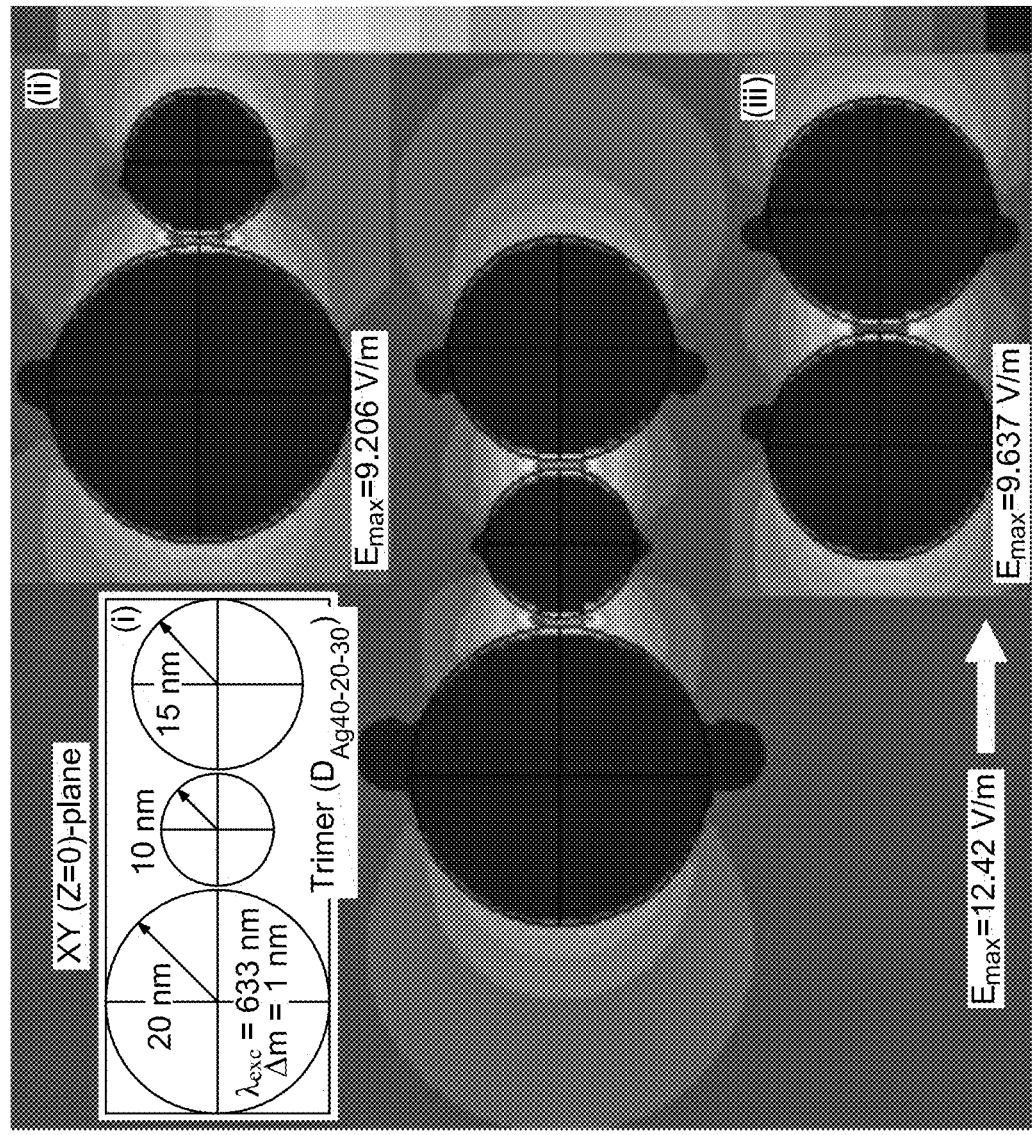
FIG. 6A illustrates an EM near-field distribution of a typical Ag-NPs-based trimer model geometry excited at s-incident polarizations, (i) corresponding model geometry along with simulation parameters, (ii) EM near-field distribution of the dimer of same NPs size, and (iii) that of different NPs size, according to certain embodiments.

According to high-resolution FESEM observations as mentioned earlier in FIG. 3 and FIG. 4, average diameter of Ag-NPs was estimated to be 29.64±4.66 nm. Therefore, geometries of trimer and dimer models were chosen in three combinations: 1) a dimer of Ag-NPs of 30 nm diameter each, 2) a dimer of Ag-NPs of 40 and 20 nm diameters and 3) a trimer of Ag-NPs of 40, and 30 nm diameters. FIG. 6A represents EM near-field distributions of the trimer at XY (Z=0) plane for the model geometry as shown in inset (i) of FIG. 6A and excited with incident excitation of s-polarization. EM near-field distributions with a maximum intensity of 12.42 V/m were found to confine at the interstitials of the trimer. It was noteworthy that the adjacent NPs in model geometry were 1 nm apart and therefore EM near-field was localized at the junction at the excitation of s-polarization. In the case of dimer of Ag-NPs of 30 and 20 nm diameters as shown in the inset (ii) of FIG. 6A, the EM near-field was found to confine at the interstitial with a bit low intensity, Emax=9.206 V/m compared to that observed in trimer. On the other hand, for the dimer of Ag-NPs of 30 nm diameter each as shown in inset (iii), the EM near-field confined at the interstitial was found to confine at the interstitial with nearly similar intensity, Emax=9.206 V/m to that observed in the case of dimer of Ag-NPs of 30 and 20 nm diameters. Insets (ii)-(iii) of FIG. 6a represent the EM near-field distributions at s-polarization for the model dimers as shown in inset (i) of FIG. 6B and FIG. 6C respectively.

Figure 6B:
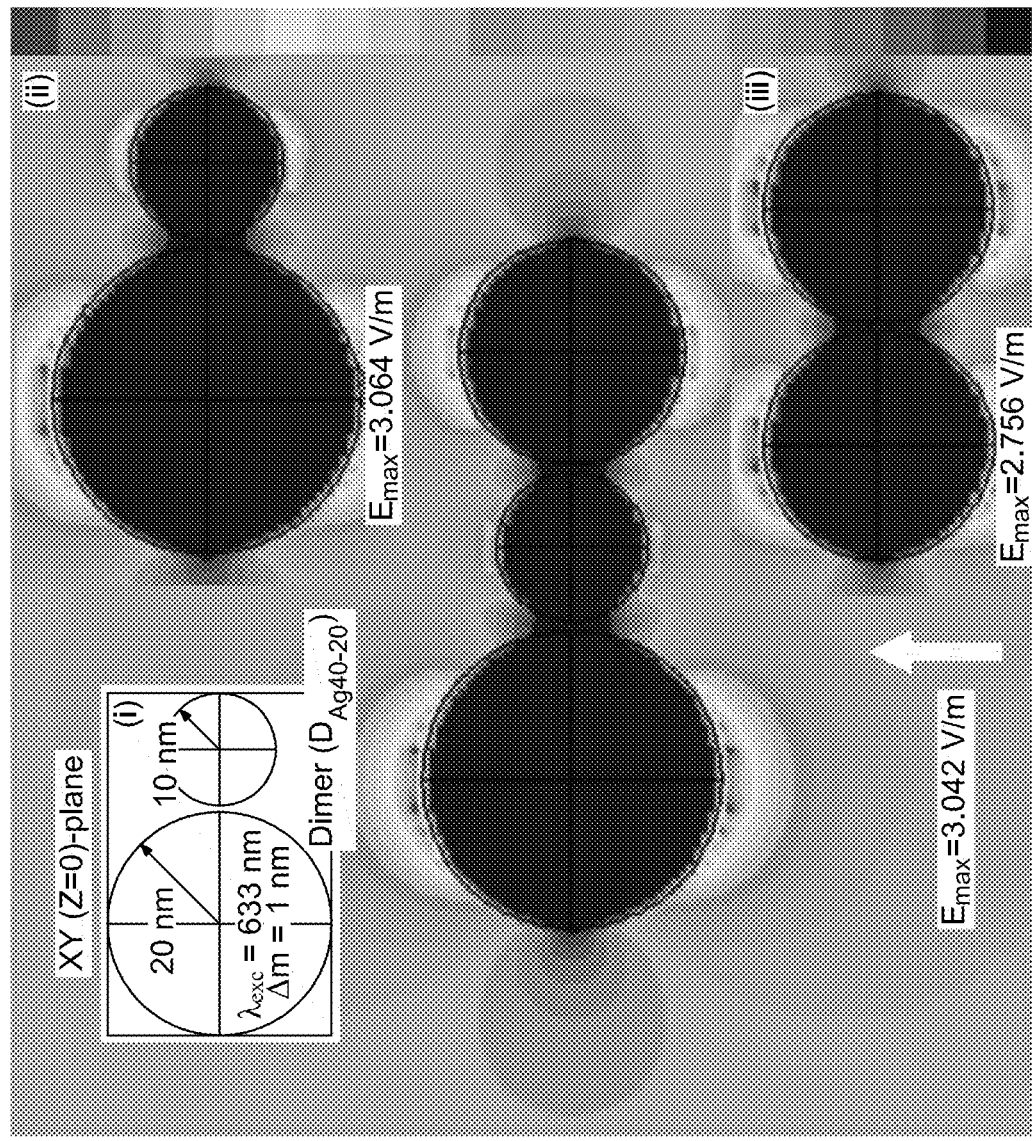
FIG. 6B illustrates an EM near-field distribution of a typical Ag-NPs-based trimer model geometry excited at p-incident polarizations, (i) corresponding model geometry along with simulation parameters, (ii) EM near-field distribution of the dimer of same NPs size, and (iii) that of different NPs size, according to certain embodiments.
Figure 6C:
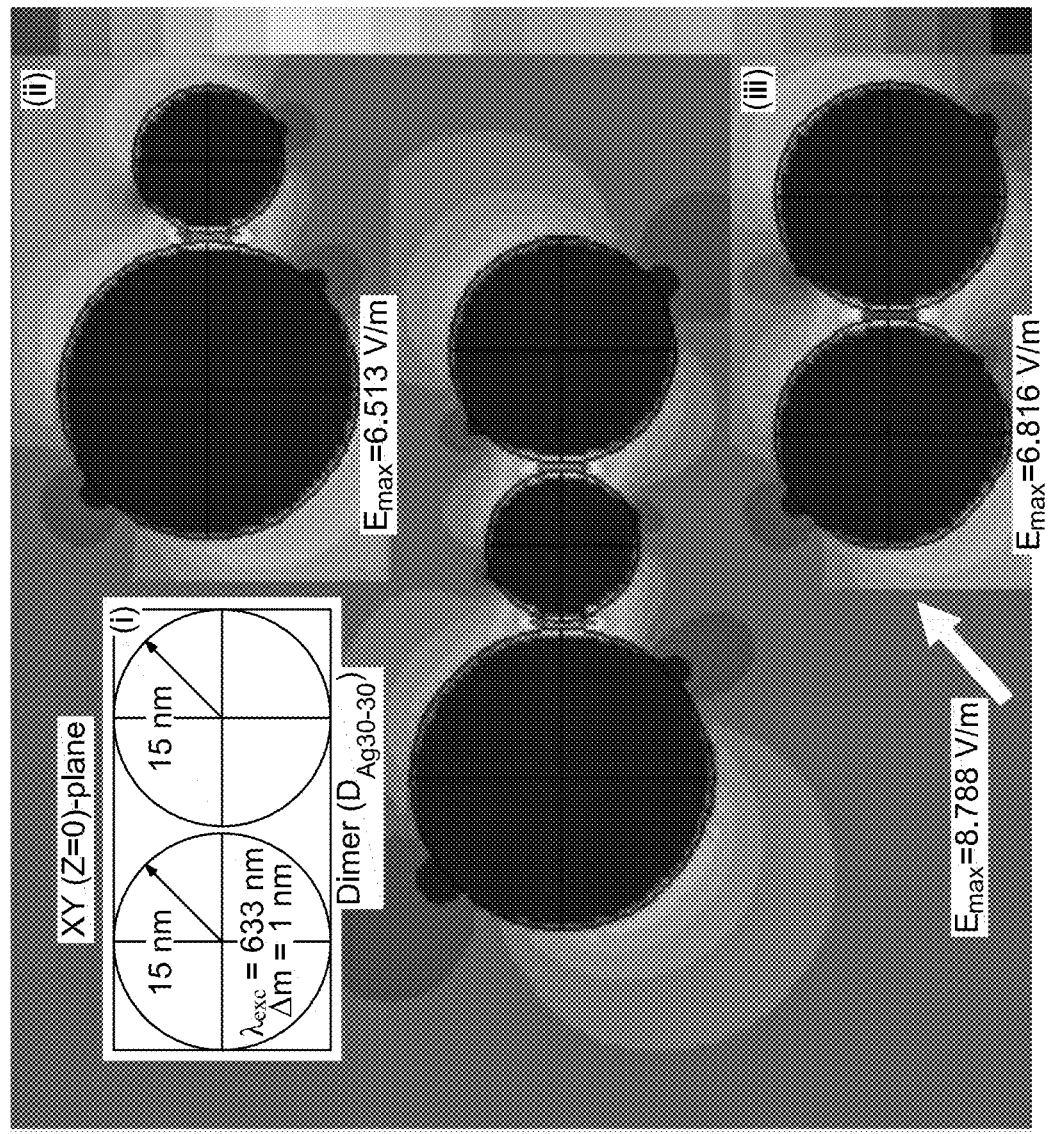
FIG. 6C illustrates an EM near-field distribution of a typical Ag-NPs-based trimer model geometry excited at 45° of incident polarizations (i) corresponding model geometry along with simulation parameters, (ii) EM near-field distribution of the dimer of same NPs size, and (iii) that of different NPs size, according to certain embodiments.
Figure 6D:
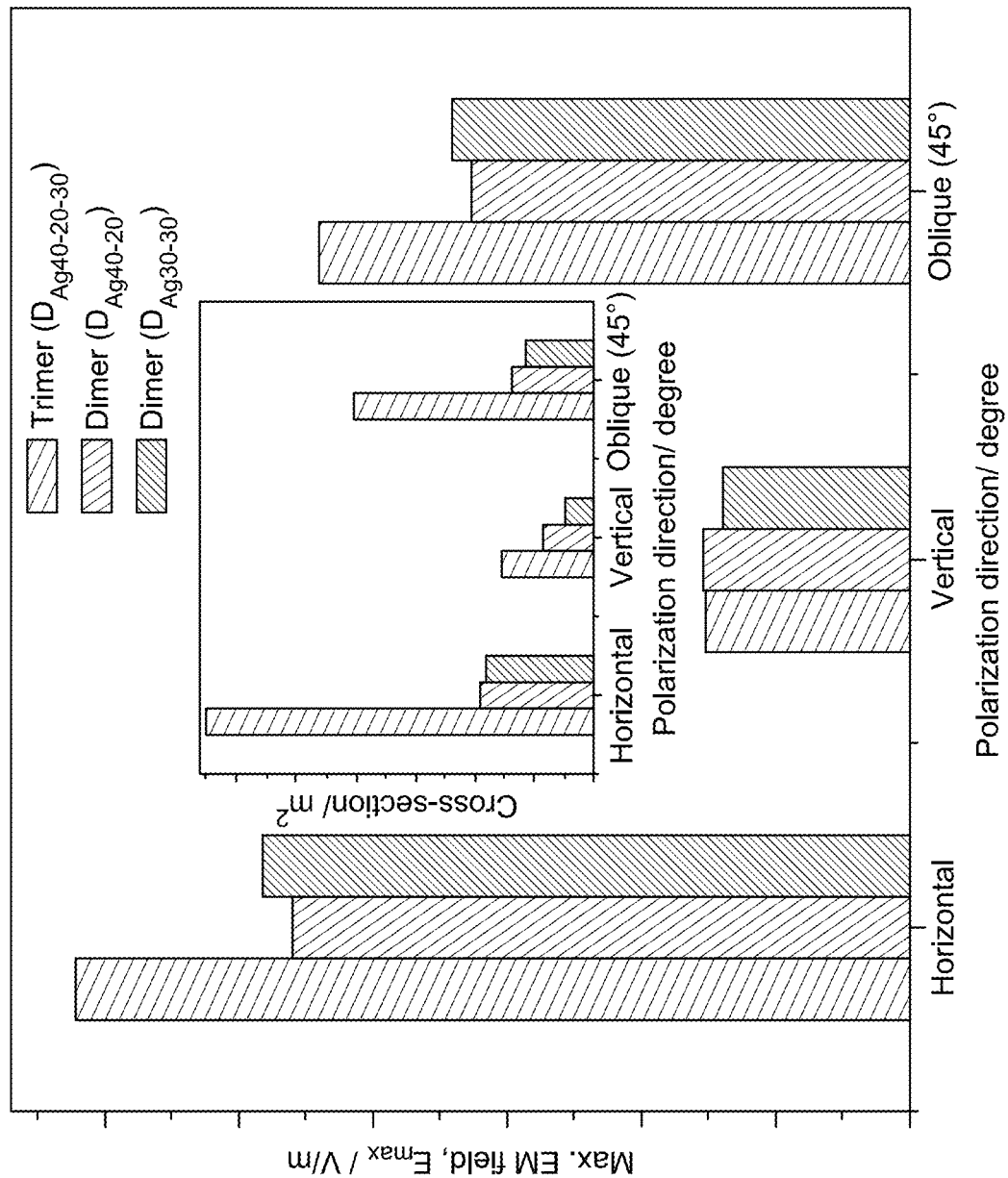
FIG. 6D illustrates maximum EM near-field of trimer and dimers simulated at s-, p- and 45° of incident polarizations, bar graph of forward cross-sections as obtained in FDTD simulations of trimer and dimers at s-, p- and 45° of incident polarizations, according to certain embodiments.

In the case of p-polarization, all the three models showed no confinement at the interstitials, since the interparticle axes were out of plane as shown in FIG. 6B. FIG. 6B represents EM near-field distributions of the trimer at XY (Z=0) plane for the model geometry as shown in inset (i) of FIG. 6A and excited with incident excitation of p-polarization. EM near-field distributions with a maximum intensity of 3.042 V/m were found to confine at the surface of individual NPs. Insets (ii)-(iii) of FIG. 6B represent the EM near-field distributions at p-polarization for the model dimers as shown in inset (i) of FIG. 6B and FIG. 6C respectively. No confinement was observed in both scenarios and the maximum electrical fields, Emax=3.064 V/m and Emax=2.756 V/m were found to confine at the surface of the dimers as shown in insets (ii) and (iii) respectively. However, in the case of incident polarization of 45°, all the models showed reasonable high EM near-field distribution as shown in FIG. 6C. FIG. 6C represents EM near-field distributions of the trimer at XY (Z=0) plane for the model geometry as shown in inset (i) of FIG. 6A and excited with incident excitation of oblique)(45°)-polarization. EM near-field distributions with a maximum intensity of 8.788 V/m were found to confine at the interstitials of the trimer. Although the interparticle axis was not in-plane to the incident polarization, EM near-field was localized at the junction at the oblique)(34°)-polarization. In the case of dimer of Ag-NPs of 30 and 20 nm diameters as shown in the inset (ii) of FIG. 6C, the EM near-field was found to confine at the interstitial with a bit low intensity, Emax=6.513 V/m compared to that observed in trimer. On the other hand, for the dimer of Ag-NPs of 30 nm diameter each as shown in inset (iii), the EM near-field confined at the interstitial was found to confine at the interstitial with nearly similar intensity, Emax=6.816 V/m to that observed in the case of dimer of Ag-NPs of 30 and 20 nm diameters. Insets (ii)-(iii) of FIG. 6C represent the EM near-field distributions at the oblique) (34°)-polarization for the model dimers as shown in inset (i) of FIG. 6B and FIG. 6C respectively. FDTD simulations revealed that trimer was having stronger EM near-field distribution compared to those extracted for dimers of different geometries as shown in FIGS. 6A-6C. FIG. 6D displays a bar graph of the maximum EM near-fields obtained for three models at s-, p- and 45° of incident polarizations. As stated earlier, the trimer exhibits higher EM near-field distributions at s- and oblique(45°) of incident polarization compared to that of dimers. On the other hand, at p- polarization, all the three models showed uniform EM near-field distributions. The inset of FIG. 6D shows scattering cross-sections obtained at s (horizontal)-, p (vertical)- and 45° (oblique) of incident polarizations using all the three models used in FDTD simulation. In the case of trimer, the scattering cross-sections at s-, p- and 45° of incident polarizations were found higher compared to those in the case of dimers.

Numerous modifications and variations of the present disclosure are possible in light of the above teachings. It is therefore to be understood that within the scope of the appended claims, the invention may be practiced otherwise than as specifically described herein.

The invention claimed is:

1. A surface-enhanced Raman scattering (SERS) substrate, comprising:
a silicon substrate having a surface having a plurality of silicon nanostructures,
wherein the silicon nanostructures have a plurality of microscale valleys having a width in a range of from 1 to 20 µm on a surface of the silicon substrate,
wherein the silicon nanostructures have a plurality of terraces in the microscale valleys, a distance measured from the highest point of a microscale valley to the lowest point of the same microscale valley being in a range of from 20 to 80 µm; and
a plurality of trimers of silver nanoparticles (Ag-NPs) disposed on the terraces of the silicon nanostructures,
wherein the Ag-NPs have a mean particle size in a range of from greater than 20 to 50 nm,
wherein the Ag-NPs are deposited directly on the silicon nanostructures,
wherein the terraces have a step structure, the terraces having an average width in a range of from 0.5 to 5 µm, and
wherein the Ag-NPs on the SERS substrate have a coverage density in a range of from $3\times10^{10}$ to $7\times10^{10}$ particles cm$^{-2}$.

2. The SERS substrate of claim 1, wherein the microscale valleys have a width of 5 to 16 µm on a surface of the silicon substrate.

3. The SERS substrate of claim 2, wherein a distance measured from the highest point of a microscale valley to the lowest point of the same microscale valley is in a range of from 30 to 70 µm.

4. The SERS substrate of claim 3, wherein the terraces have a step structure, and wherein the terraces have an average width in a range of from 1 to 4 µm.

5. The SERS substrate of claim 4, wherein the Ag-NPs have a mean particle size of 30 to 40 nm.

6. The SERS substrate of claim 1, wherein the Ag-NPs are at least one form selected from the group consisting of nanospheres, nanorods, nanostars, nanotriangles, nanoprisms, nanocubes, nanofibers, nanoplates, nanowires, nanotetrahedrons, nanocrystals, nanohexagons, nanodisks, nanoribbons, nanocylinders, nanogranules, nanowhiskers, nanoflakes, nanofoils, nanopowders, nanoholes, nanobelts, nanourchins, nanoflowers, nanoislands, and nanomeshes.

7. The SERS substrate of claim 1, wherein the Ag-NPs on the SERS substrate have a coverage density in a range of from $4\times10^{10}$ to $7\times10^{10}$ particles cm$^{-2}$.

8. The SERS substrate of claim 1, having an electromagnetic (EM) intensity in a range of from 2 to 20 volts per meter.

9. A method of preparing the SERS substrate of claim 1, the method comprising:
treating the silicon substrate in a first aqueous solution containing HF and a metal salt to form a treated Si substrate;
etching the treated Si substrate in a second aqueous solution containing HF and $H_2O_2$ and washing with a third aqueous solution containing $H_2O$ and at least one acid to form an Si substrate with etched silicon nanostructures; and
at least partially thermally evaporating the metal particles of a metal target onto the silicon substrate with etched silicon nanostructures to form the SERS substrate.

10. The method of claim 9, wherein the silicon substrate is a p-type silicon wafer.

11. The method of claim 9, wherein the metal salt comprises a gold salt, a silver salt, a copper salt, a platinum salt, an iron salt, and/or a palladium salt.

12. The method of claim 11, wherein the metal salt is $AgNO_3$.

13. The method of claim 9, wherein a molar ratio of HF to the metal salt is in a range of from 500:1 to 50:1.

14. The method of claim 9, wherein the acid comprises hydrochloric acid, sulfuric acid, phosphoric acid, nitric acid, acetic acid, boric acid, oxalic acid, citric acid, carbonic acid, perchloric acid, chlorous acid, nitrous acid, ethanoic acid, hypochlorous acid, and/or hydrocyanic acid.

15. The method of claim 14, wherein the acid comprises hydrochloric acid and nitric acid.

16. The method of claim 9, wherein the metal particles of the metal target are thermally evaporated at a temperature in a range of from 700 to 1500° C. at a power in a range of from 0.1 to 2 amperes (A) per milligram of the metal target under vacuum;
wherein the metal particles are silver particles, and the metal target is silver.

17. A method for measuring surface enhanced Raman scattering (SERS) signal of an analyte, the method comprising:
contacting the analyte with the SERS substrate of claim 1 to form a sample;
exposing the sample to laser light such that a portion of the laser light is scattered by the sample to form scattered light; and
detecting the scattered light;
wherein the analyte has a Raman scattering signal that is enhanced relative to that of the analyte without contacting with the SERS substrate.

18. The method of claim 17, wherein the analyte comprises at least one molecule selected from the group consisting of a synthetic molecule, a protein, a deoxyribonucleic acid sequence, a ribonucleic acid sequence, an amino acid, a peptide, a nucleotide, a nucleoside, and a neurotransmitter.

19. The method of claim 18, wherein the analyte comprises Rhodamine 6G.

20. The method of claim 17, wherein the laser light has a wavelength of 600 to 650 nm, and the SERS substrate has an enhancement factor in a range of from $3\times10^5$ to $50\times10^5$.

* * * * *